(12) United States Patent
Li

(10) Patent No.: US 6,599,781 B1
(45) Date of Patent: Jul. 29, 2003

(54) SOLID STATE DEVICE

(76) Inventor: Chou H. Li, 8001 Sailboat Key Blvd., Unit 404, S. Pasadena, FL (US) 33707

( * ) Notice: Subject to any disclaimer, the term of this patent is extended or adjusted under 35 U.S.C. 154(b) by 0 days.

(21) Appl. No.: 09/670,571

(22) Filed: Sep. 27, 2000

(51) Int. Cl.$^7$ .............................................. H01L 21/335
(52) U.S. Cl. ........................ 438/142; 257/140; 257/146
(58) Field of Search ..................... 438/22, 24, 27, 438/142, 421; 257/9, 140, 146, 496, 510

(56) References Cited

U.S. PATENT DOCUMENTS 3,648,125 A * 3/1972 Peltzer ....................... 257/515
4,690,714 A * 9/1987 Li ............................. 438/24
4,946,800 A * 8/1990 Li ............................. 438/421

* cited by examiner

Primary Examiner—David Nelms
Assistant Examiner—Andy Huynh
(74) Attorney, Agent, or Firm—James A. Poulos, III

(57) ABSTRACT

A method of mass-producing a solid state device comprises supplying a solid state material substrate; providing two adjacent semiconductor pockets on the substrate; and forming a gate layer less than 3 to 40 Angstroms thick. The gate layer has atomically smooth major surfaces, and perfectly bonded onto the substrate to bridge a gap between the two semiconductor pockets.

36 Claims, 2 Drawing Sheets

SOLID STATE DEVICE

BACKGROUND OF THE INVENTION

1. Field of the Invention

The invention relates to solid state integrated circuit devices and more particulary to improved, miniaturized semiconductor integrated circuit devices.

2. Description of Related Art

Shockley, Bardeen, and Brattain invented the transistor around 1950 and started the modern electronics age. Kilby and Noyce next combined active and passive components on a single chip and invented the integrated circuit. Fairchild's Isoplanar technology (FIG. 1) made possible medium-scale and larger-scale integrated circuits in 1972 according to Peltzer's U.S. Pat. No. 3,648,125. Simultaneously, other similar dielectric isolation processes such as Kooi's LOCOS (i.e., local oxide isolation technology) of Philip and Magdos's oxide-recessed technology of IBM were also widely used. In a 1976 Interference No. 98,426, Li's application No. 154,300 on round-bottomed isolating oxide groove was considered as the "Seniormost Inventor" among Fairchild's Peltzer, Philip's Kooi, and IBM's Magdo and Magdo.

According to Peltzer's patent, the Fairchild's Isoplanar device 40 as typified by FIG. 4 in his patent has a n-type epitaxial silicon layer 42 formed on a p-type substrate 41. Oxide isolating regions, e.g., 44a, 44b, 44c, and 44d were used to isolate the different components. Each of these oxide isolating regions has a central flat bottom occupying much chip real estate producing unnecessarily larger devices.

Li's round-bottomed isolating oxide groove 21 of FIG. 21 in 154,300 application improves device leakage current and breakdown voltage. The groove bottom G of zero width eliminates the wasted chip real estate of all other previously existing devices of, e.g., Isoplanar, LOCOS, and oxide-recessed types. This feature produces smaller devices. The oxide isolating regions in this present invention are further narrowed down to even one or two atomic layers occupying the minimum chip real estate. Li's devices also have rounded PN junction peripheral surfaces minimizing contamination by micron-size or even atomic particles thereby increasing yields. See FIG. 2. The smaller the device size, the more critical this yield factor.

In the 154,300 patent application, the device of FIG. 2 is made by thermally growing an oxide groove, band, or material region 21 transversely into a p-type silicon substrate 22. This is followed by oxide-guided, maskless diffusion of n-type dopants from the top surface 23 to give the top n-type silicon layer 24 and the new PN junction region 25. The rounded bottom G has a zero bottom width.

All these devices can still be improved in performance and device size. The present invention provides still better and further miniaturized solid-state integrated circuits in general and semiconductor integrated circuits in particular.

Specifically, this invention will address the following issues:

1) improving the critical gate layer thickness and structure;
2) reducing the insulating field oxide region size by orders of magnitude from microns to Angstroms;
3) making the entire device more resistant to temperature, stress, impact, vibration, and high-gravity (G) forces due to rapid acceleration and deceleration;
4) simplifying a device material inventories and manufacturing process;
5) providing a new type of high-performance flexible circuits; and
6) designing three-dimensional (3-D) atomic or molecular diode or transistor arrays or circuits especially useful for supercomputers and electro-optical telecommunications.

The devices of the invention may use different solid-state or semiconductor materials including Si, Ge, Si—Ge, InP, GaAs, SiC, InAs, superconductor, and diamond. In this invention, Si semiconductor materials are exclusively used by way of illustration. Metal-oxide-semiconductor (MOS) or, in general, conductor-insulator-semiconductor (CIS) devices are used exclusively as examples in this specification. Other types of solid-state and semiconductor circuit devices are also useful. Specifically, electro optical, superconductor, magnetic, ferro electric memory, electrooptomagnetic, and other solid-state devices can also be designed according to principles of this invention.

The "heart" of the transistor is the gate dielectric, where most electronic actions and the associated device heating or degradations occur. The gate oxide is the smallest but a critical feature of the transistor. It lies between the transistor's gate electrode, which turns current flow, and the silicon channel through which the current flows. The gate oxide insulates and protects the channel from the gate electrode preventing short circuits. Shrinking this oxide layer allows more current out of the switch with less voltage. More than any other part of the structure, this layer determines the device performance and reliability. Many think that this insulating layer would be the limiting factor for producing increasingly smaller chips.

The thickness of gate oxides is the subject of intense research. Bell Laboratory scientists have created a 5-atom silicon dioxide layer that included a 1-atom transition layer between this layer and substrate. A rapid thermal oxidation technique was used using pure oxygen at 1,000 C. for 10 seconds. Oxides less than 6 angstroms or 3 atoms have been made, but the leakage current was not manageable. Additional reliability issues included adhesion loss, texture, thermally or mechanically induced cracking, moisture adsorption, step coverage, and time-dependent behavior such as thermal conductivity, and breakdown voltage. The reduced mechanical strength is critical in both packaging and processing such as during chemical-mechanical polishing.

Traditionally, the gate dielectric is a thermally grown layer of silicon dioxide (SiO2) layer averaged about 25 atoms thick. By continually reducing the gate oxide thickness and the length of the gate electrode, the semiconductor industry has doubled the transistor's switching speed every 18 to 24 months according to the Moores Law. This has worked remarkably well, but problems exist. One is that the oxide often permits boron penetration from the gate into the threshold region, degrading the threshold voltage and device performance. The other problem is that, as device size shrinks, the gate oxide becomes so thin that tunneling currents arise from the gate through the oxide to the substrate, again degrading the device performance.

To overcome the first problem, transistor engineers have developed solutions involving stacked gates and various nitridation techniques. Nitradation adds nitrogen to the silicon dioxide. A successful two-step oxidation/nitridation approach using a sequential in situ steam generation and rapid plasma nitridation process shows a 5–7 times reduction in current leakage compared to SiO2 at an effective oxide thickness of less than 20 A (or Angstroms).

The second problem relates to current tunneling through very thin oxide. This problem is more difficult and thought to require a change of materials. The tunneling current rises very quickly as the oxide is thinned down. It is believed that below about 14–15 A, new material must be used to replace the silicon dioxide. One would look for a thinner but defect-free SiO2 film to avoid the excessive leakage current. The new high-k materials must be put in place as the 14–15A SiO2 layers. Some solutions are possible, but none fit all needs.

The new insulating material must also have the right dielectric constant and be chemically compatible with silicon to get the right interface. Interface remains a critical and largely unknown area of research. Interface microengineering may in fact be the key factor that will allow the new or old materials to continue the scaling of field-effect transistors (FET).

The defect-free gate dielectric layer must be put down uniformly in a thin film to tolerate subsequent silicon processing and temperature cycling. There is still no suitable high dielectric constant material and interface layer with the stability and interface characteristics to serve as a gate dielectric.

Metal silicates may be good candidates. Hafnium and zirconium silicates are stable in contact with silicon, between substrate and dielectric. Tantalum pentoxide is also available.

Even with a material other than SiO2, a very thin SiO2 layer will probably still be required at the channel and/or gate electrode interface to preserve interface state characteristics and channel mobility. This would severely reduce any benefits due to the high-k dielectric. It is clear the first 10 A above the silicon substrate largely determine the leakage properties of the dielectric and the carrier mobilities in the channel underneath. Once past that, only the bulk properties of the film needs to be dealt with. Controlling these properties will be critical to the success of high-k materials. Some hope exists to shrink the silicon dioxide down to 0.1 um (or microns) thick using plasma nitridation to control the first 10 A or so of the dielectric.

The gate material is often a doped polysilicon with a silicide on top. Interest exists in switching the polysilicon to a metal due to depletion effects associated with the poly. When the device is turned on, the polysilicon actually depletes a little bit making it look like a thicker oxide. This depletion effect leads to less drive current—a characteristic of a semiconductor material rather than a metal. Still, high dielectric (k) material is moving from the doped polysilicon now used to a metal.

The advantage of metal gates is that this depletion effect is avoided, and the gate resistance is lowered. But two disadvantages to metal gates arise. The metal work function of the gate is fixed by the metal. By comparison, the work function in polysilicon is controllable by varying doping of either n-type or p-type. This allows optimization of the threshold voltages for both the n-channel and p-channel transistor. Such an optimization is not possible with metal.

The main focus of present transistor engineering effort is to maximize the drive current. The present transistor is a current source charging a large capacitor. The higher the current source and the smaller the capacitance, the faster it charges. All the industry's scaling efforts are toward improving the drive current at lower voltages. Second to optimizing the drive current is a need to reduce parasitic capacitances at the device and interconnect levels.

Sixteen (16) ion implantation steps are commonly used to create the sources and drains for the PMOS and NMOS devices and the retrograde wells in which they sit. Implantation is also used to dope the gates and to provide the "punchthrough stop" pockets. After the implantation, the device must be annealed at a relatively high temperature to remove the implantation damages, to "activate" the dopants, and to insure that all dopant atoms lie exactly where needed.

The junction depth for source/drains should be only 35–70 nm deep for the 100 nm (or 0.1 um) generation due to go into production in 2005. Drain extensions should only be less than 20–33 nm deep. The abruptness of the source and drain extensions is critical. There are still no known solutions in several areas. Many believe computer modeling will help researchers determine the optimal doping profile and study the impact of various process parameters on dopant diffusion. A few degrees in temperature can have a significant effect on the doping profiles. Aggressive scaling of the transistor source/drain junction depth requires production-worthy (milli-Amps for 300 nm wafers) ion beam current at sub-Kev energies for boron. The requirement for sub-Kev implants is primarily driven by the need to reduce transient enhanced diffusion. Sputtering related dopant loss and other phenomena will likely preclude using sub-Kev implant energies below 0.5 Kev regardless of available beam current.

Reducing the implant energy, and annealing time and dose is of primary importance for achieving the shallowest junctions. Ultra-fast ramp-up rates are of secondary importance. Their potential benefit can only be captured with an equally fast but not achievable ramp-down rate. Several combinations of implant and annealing parameters (implant energy or dose, and annealing temperature, time and ramp rates) are possible that yield the same junction solutions. It is essential to select solutions which optimize manufacturability.

The semiconductor industry continues to require doubling device functionality every two years or so. It is thought this requires switching to new materials. Instead of aluminum, silicon dioxide, and polysilicon, some think that future integrated circuits will be built from copper, low-dielectrics and high-k dielectrics, and "exotic" metals like hafnium and zirconium.

The traditional silicon dioxide gate insulator needs close thickness control and low defect density. These may be met by improved cleaning and oxidation techniques. As the required layer becomes thinner, leakage currents and reliability problems arise. Direct tunneling can occur in very thin layers, giving high leakage current. At 100 degrees C., the maximum voltage rating of a 2.5 nm thick layer of silicon dioxide is only 1.5 V.

A silicon dioxide/dual-doped polysilicon gate stack process is used as the mainstay of CMOS device manufacturing since its inception. The new critical CMOS gate stack process would require high-k dielectric gate insulators, with a dual metal gate electrode. The use of this new process should be no later than five years. This is generally thought impossible.

A flowable oxide based on hydrogen silsesquioxane is often used to form ultrathin low-k insulating layers. Use of these layers reduces parasitic capacitance shortening propagation delays. These changes increase by 30% the within-chip processing speed as compared with other 180 nm CMOS processes. processes.

High-k dielectrics are one of the major road blocks in device scaling. With extremely smooth gate dielectric and very small channel length, the transistor drive current goes ballistic, increasing the input current flows via the channel from the usual 35% to 85%. The remaining input current collides with the rough edges of the insulating layer.

Low-k polymer dielectrics have been used to replace glass insulators and to separate the new copper wires in its new chips. Copper lead wires are also replacing aluminum wires. This material combination will push chip speeds one-third faster than today's fastest chips. There are, however, problems to using this system: 1) the plastic is much softer than glass and does not stay in place, making it difficult to make the chips; and 2) these polymers do not stick to other materials including silicon and other polymers.

Tungsten is replacing the aluminum interconnects. The use of tungsten reduces the conductor widths down to 240 nm below the normal metal layers at the gate level. The extra routing flexibility achieved by the local interconnect reduces 10–20% of the silicon area. The spacing between tracks in the first metal layer can be considerably increased to reduce sensitivity of this layer to defects thereby increasing device yields. However, the very high tungsten density of 19.3 (vs. 2.7 for Al and 2.33 for silicon or silicon dioxide) induces deboning of tungsten from other materials during fast accelerations and decelerations, as shown later.

The capacitance between the gate and channel of an insulated gate FET should be high. In small area devices, this cannot be achieved by using a very thin silicon dioxide layer, or the leakage current will be too high due to material imperfections. A polysilicon gate electrode has been used with germanium doping to control the work function of the material. A variety of metals will be tried as gate electrodes, with TiN/Al or TiN/W being the most likely candidates. Also considered is deposition of high-k gate insulators by the atomic layer chemical vapor deposition technique using aluminum oxide, hafnium oxide, titanium oxide, zirconium oxide and silicates of zirconium and hafnium.

Ballistic effects occur around the 30 nm channel length when the electrons emitted from the source arrive at the drain without scattering. Small dimensions have great impact on electrons. The channel lengths of conventional transistors are so long that electrons seldom go all the way from the source to the drain without scattering. But when the channel length gets down to around 35 nm, the ballistic component increases and device performance improves. However, once ballisting occurs, further reduction of the channel length no longer improves the performance. Electrons travel better when the gate oxide is slightly thicker because they are less attracted to the gate directly above the gate oxide layer.

There still is plenty of life left in traditional gate structure. Take, for example, the "ballistic nanotransistors". In these devices, dramatic gains in drive current are possible simply by combining a very smooth gate dielectric with a short channel length, such as in Vertical MOSFET. The main challenge is to replace the traditional silicon dioxide/dual-doped polysilicon gate stack process. This stack process has been the mainstay of complementary metal-oxide-semiconductor (CMOS) device manufacturing since its inception. The new CMOS gate stack process will require cost-effective, low-temperature integration of nanometer scale high-k dielectric gate insulators, with dual metal gate electrodes. The replacement should be within five years. History has shown, however, that changes of this magnitude normally require at least ten years to implement.

The very slow progress in finding new semiconductor materials is looming as a grand challenge in chip design. There are still many, many problems that are material-limited. New material selection, design, and processing methods must be found. The whole manufacturing process is too complicated to achieve high repeatability and good device yield and performance. Most of the materials are not applied in optimal ways. This invention will address many of these issues.

SUMMARY OF THE INVENTION

A solid state device comprises a first semiconductor region of a first conductivity type; an insulating material region containing at a selected location therein at least one n-type or p-type dopant region and positioned on top of the semiconductor region; and a second semiconductor region of a second conductivity type and positioned on top of the insulating material region. The at least one dopant region in the insulating material region forms a PN junction region with either one of said first and second semiconductor regions. The PN junction is of no more than a size selected from the group consisting of one half of a micron, 0.1 micron, and 3 angstroms. A method of making the device is also disclosed.

To overcome the foregoing and other difficulties, the general object of this invention is to provide an improved, semiconductor or solid-state integrated circuit device with improved performance, yield, cost, and miniaturization;

A broad object of the invention is to provide an integrated semiconductor circuit with a submicron or Angstrom-thin isolating material layer to form at least one of the critical parts thereof.

Another object of the invention is to provide a new, improved gate or field layer which can be easily and rapidly produced at high yield and low cost.

Yet another object of the invention is to provide a new, improved field isolation layer that not only improves circuit performance but allows significant miniaturization.

A further object of the invention is to provide an integrated semiconductor circuit with an isolating material layer which is sufficiently thin and flexible, thereby not only advancing device miniaturization, but improving circuit performance and minimizing thermal or volume expansion mismatch stresses on the circuit.

Another object of the invention is to provide a new generation of low-cost environment-resistant flexible circuits.

A still further object of the invention to mass-produce, at low cost but high yields, wafer chips each containing thousands or millions of transistors more miniaturized than is presently possible.

Yet another object of the invention is to provide highly miniaturized electro-optical three-dimensional, integrated atomic or molecular diode or transistor arrays especially suitable for and optical telecommunication.

BRIEF DESCRIPTION OF THE DRAWINGS

Various other objects, features, and advantages, and a more complete understanding of the invention, will become apparent to those skilled in the art from the following description and claims, taken in conjunction with the accompanying drawings.

For the purpose of illustrating the invention, there is shown in the drawing the forms which are particularly preferred. It is understood, however, that the invention is not necessarily limited to some of the precise arrangements and instrumentalities here shown but, instead, may combine the same described embodiments or their equivalents in various forms.

DESCRIPTION OF THE PREFERRED EMBODIMENT

Various other objects and advantages, and a more complete understanding of the invention, will become apparent to those skilled in the art from the following description and claims, taken in conjunction with the accompanying drawings.

Figure 1:
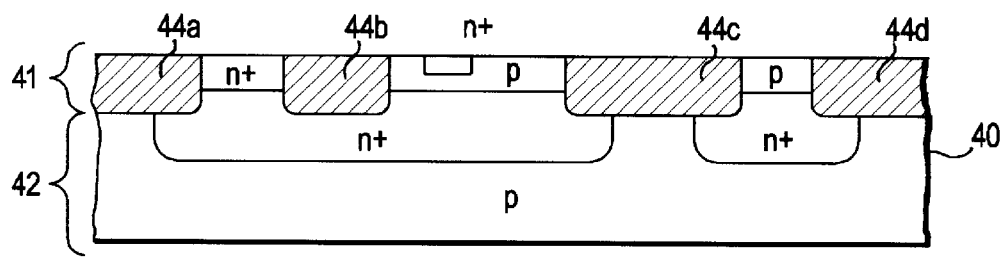
FIG. 1 is a partial vertical cross-section of a Fairchild's prior-art Isoplanar MOS device with a flat-bottomed and vertically straight-sided isolating oxide grooves.

Several of the prior-art methods described below are useful or even necessary to make the extremely small precision semiconductor circuits of the present invention:

1) As shown in Li's U.S. Pat. Nos. 3,430,109 and 3,585,714 patents, one can use a number of microscopically precise methods to remove materials on, or implant foreign atoms into, the device wafer:
   a) mechanical grinding or polishing with realtime feedback control (See: U.S. Pat. No. 3,430,109, FIG. 1 and col. 2, lines 38–64 (or U.S. Pat. No. 3,430,109: 2/38–64);
   b) repeated precision chemical etchings immediately after precoolings to prevent localized, nonuniform or preferential deep etching at inclusions, dislocations and subgrain boundaries (U.S. Pat. No. 3,585,714: 11/75–12/59);
   c) energetic particle bombarding with aligned or focused ion, electron, proton, laser photons, or argon particles (U.S. Pat. No. 3,585,714: 11/24–42). Such energetic particle beams can precisely remove material by locally heating up or energizing the intercepting surface atoms to evaporation or ejection. Ions and proton beams of selected foreign atoms, such as O, N, A, Si, Ge, Ga, B, P, and As, can also be microscopically precisely implanted into semiconductor wafers; and
   d) combination of the above methods.

The precision grooves so made have many different types: cylindrical, ellipsoidal, spherical, or conical, with a radius of curvature of 1 cm, 0.1 cm, 0.001 cm, 1 micron, 0.1 microns, or even less. See, for example, subgroove 18 in FIG. 1 of U.S. Pat. Nos. 3,585,714, 154,300 and U.S. Pat. No. 5,696,402.

Laser processing and ion implantation are particularly important. Laser beams can be controlled by simple stable optics, while electron and ion beams by electrostatic deflecting means. According to Li, all the above material processing methods automatically provide sensors to monitor in real time the degree or progress of material removal from, or introduction into, the device wafer. Real-time monitoring provides realtime closed-loop feedback control to achieve very high precision and accuracy to submicrons or even single atoms. Precise depressions or isolating material grooves in silicon can be microscopically accurate in its depth, curvatures, shape, size, chemical composition profiling, and lateral locations.

By "microscopic", I refer in this application to dimensions, accuracies, precisions, curvatures, shape or composition profiling of less than one half or 0.1 microns.

The gate and field isolating layers of MOS transistors are usually made by thermal oxidation or nitridation. Thermal oxidation of silicon with Si3N4 masks was well known prior to 1968. See, e.g., V. Y. Doo in "Silicon Nitride, A New Diffusion Mask," IEEE Transactions on Electron Devices, Vol. 13, No. 7, 1966, pp 561–563. Various metal layers such as Ni, Au, Pt may also be used as masks in thermal oxidation and nitridation.

As an alternative to thermal oxidation or nitridation, oxygen and nitrogen may be introduced into the silicon by ion or proton implantation. Under an implanting voltage of one megavolt, for example, oxygen and nitrogen ions can be introduced into silicon host to a depth of 1.7+/−0.13 um and 1.87 +/−0.12 um, respectively. Because of its excellent spatial and dose control and ease of manufacture, ion implantation has become the most prevalent method of adding foreign atoms into semiconductors Shockley, Gale, Kellett et al, Sibley, and Wilson invented various important ion implantation techniques, as disclosed respectively in U.S. Pat. Nos. 2,787,564; 2,434,894; 3,341,754; 3,326,176; and 3,563,809:

Shockely in October 1954 showed that:
1) use of mass spectroscopy separates ions of different masses to generate mono-energetic ion beams for uniform penetration. See U.S. Pat. No. 2,787,564, column 4, lines 72 to column 5, line 27 (or 4/72–5/27);
2) by varying the accelerating potential variations in the implanting location and depth of penetration may be achieved;
3) By using a suitable apertured mask, moving the wafer, or sweeping the ion beam with a deflection system intermediate between the cathode and the work, predetermined geometry of the implanted region is possible (U.S. Pat. No. 2,787,564: 2/19–23);
4) Ion-implanted semiconductor can be annealed at relatively low temperatures to stabilize and repair radiation damage in the newly formed interior zone without appreciable thermal migration of the implanted atoms (U.S. Pat. No. 2,787,564: 5/18–24 and 2/9–15).

Gale taught the use of a magnetic ion optical system to deflect and focus the ion beam, and to achieve a size reduction of 100:1. Thus, a mask of 100-micron square apertures gives one-micron squares at the substrate, and a 1 micron wide tracks can be achieved (U.S. Pat. No. 2,434,894: 3/71–72, 6/59–61, and 5/16–18). No mask is needed (6/19–21).

Kellett et al taught that ion penetrates straight into the material into the desired location and depth, and does not diffuse in the body of the silicon after implantation. The boundaries of the implanted region are sharp. In particular, the edge of the implanted region may be controlled with great accuracy down to some few hundred atomic layers (U.S. Pat. No. 3,341,754: 3/20–25). Sharp boundaries result from the annealing of irradiated regions at typically 400–800 Degrees Centigrade for 10 minutes. The annealing gives an oxygen (or nitrogen) diffusion length of at least two or three orders of magnitude smaller than that due to the common thermal oxidation above 1,000 degrees Centigrade for two hours.

Sibley used computer-programmed control on the deflecting means to "write" with a collimated ion beam of selected mass to produce a predetermined integrated circuit pattern on the workpiece (U.S. Pat. No. 3,326,176: 2/20–62).

Wilson showed that implantation of oxygen or nitrogen forms electrically insulating and protective films of a silicon dioxide or silicon nitride thereon (U.S. Pat. No. 3,563,809: 4/37–41). The shape, size, and location of the resultant oxide or nitride grooves can be microscopically and accurately controlled with the ion implantation method. The width of the groove when ion implantation is used can be less than a micron using a relative movement between the implanting beam and the silicon material, with corresponding adjustment of beam characteristics such as beam energy, current, profile, and focusing, so as to achieve the desired precise groove shape and chemical composition (U.S. Pat. No. 3,563,809: 14–26–15/4).

Hence, through precise control of beam size and aiming point by, e.g., aligning, focusing, aligning or both, ion implantation can control the dimension, shape, and three-dimensional chemical compositions to fractional micron accuracies. Other unique features of implanted ions include:

1) straight penetration without appreciable lateral diffusion to give orders of magnitude sharper boundaries than other conventional methods;
2) contr1olled size of the implantation region down to less than 1 micron, with an accuracy of 1,000 Angstroms (0.10 microns) down to 10 Angstroms;
3) the ions can be implanted without masking, wet chemistry, and photolithography;
4) the implanted region need not start at the surface of contact with the foreign matter;
5) the shape and three-dimensional chemical composition of the ions can be controlled to fractional micron accuracy; and
6) when used for PN junction or oxide/nitride groove formation, the chemical composition profiles and, in particular, critical PN junction grading, can be of any selected shape, rather than only the exponential or erfc grading obtained with thermal diffusion, respectively for limited or infinite surface diffusion source by thermal diffusion.

Sibley in U.S. Pat. No. 3,326,176 already disclosed "writing" with ion means of selected mass. Recent developments allow the exact positioning of single atoms on a substrate. In 1999, Cornell University researchers observed atomic bonds by combining scanning tunneling microscope with vibrational spectroscopy. This technique makes it possible to individually move atoms or molecules to create very small structures. The scanning tunneling microscope won the Nobel prize and has become the standard worldwide submicron "tweezers" used to sculpt nanotechnologically atom by atom. Using atomic force microscopy, letters of single atoms have been written on silicon substrates. Conferences on manipulating single atoms into precise positions and other related topics such as atomic-layer CVD and molecular atomic spectroscopy are common these days.

A very brief review of commonly used electronic materials is also in order. The semiconductor transistor structures that we know today have been built on four basic materials: silicon at the base, silicon dioxide as an insulator, silicon nitride for the sidewall, and aluminum for interconnect. These and other electronic device materials vary greatly in electrical resistivities. The resistivities of metals such as Al, Cu, Au, and W are in the range of 1–10 microohm-cm, those of insulators such as diamond, glass, and quartz are 10 to the 10–18 ohm-cm. Semiconductors, such as Si, Ge, diamond, SiC, and InP, have resistivities that lie in between metals and insulators. After doping by thermal diffusion or ion implantation, a semiconductor can have very low resistivities close to metals, to remain as a semiconductor, or to have very high resistivities close to insulators. In the last case, the valence and conduction bands of the perfect silicon is totally filled. There are therefore no electrons or holes that can be accelerated, and no current can flow. A perfect or intrinsic crystal of silicon acts, therefore, as an insulator useful for metal-oxide-semiconductor (MOS) or, broadly, conductor-insulator-semiconductor (CIS) devices.

That such a practically useful MOS or CIS device is possible can be seen as follows. Conventional MOS devices sold by the millions or billions have gate oxide layers which actually are not pure silicon dioxide layers at all. This is because the oxide is in-situ thermally oxidized from, or ion-implanted into, not a pure silicon substrate, but an impure silicon substrate containing at least parts-per million (ppm) or parts-per-billion (ppb) of impurities such as Al, Na, Fe, Mg, Ca, P, B, As, Sb, O, N, and the like. The so-called "silicon" used to produce the oxide is actually a complex silicon alloy of many unwanted chemical elements. The "silicon dioxide" formed on this impure silicon alloy is also actually an impure silicon oxide compound containing various insulating, semiconducting, or even conducting oxides of different metals or metal alloys in varying proportions. Nevertheless, such an impure silicon dioxide material form extremely useful gate or field oxide layer materials on all the billions of existing "silicon" integrated circuit devices.

As shown above, an intrinsic silicon material is often an insulator. Depending on its purity, a practical intrinsic silicon material can be sufficiently electrically insulating, in comparison to or when used in combination with the usual p-type "silicon" substrate and n-type "silicon" pockets, to form the gate or field oxide layers of a practically useful MOS or CIS device. As will be shown shortly, such an intrinsic silicon MOS or CIS device is, at least as to environmental resistance, distinctly much better than the conventional MOS or CIS devices, even though they may be less pure and, thereby electrically more leaky.

The use of intrinsic silicon to replace the common field oxide isolating groove was disclosed on Sep. 23, 1968 as FIG. 3 in Li's application Ser. No. 154,300. Such a groove was first claimed in Li's application Ser. Nos. 08/483,937 and 08/483,938, both filed Jun. 7, 1995. I hereby incorporate by references these three prior Li applications into this application.

Figure 3A:
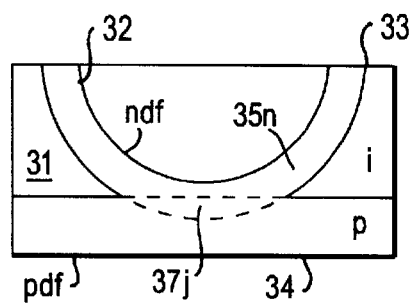
FIGS. 3(a) and 3(b) show two partial vertical cross-sections of intrinsic conductor-insulator-semiconductor (CIS) devices in Li's 154,300 application.

In these two and all the intervening applications, the intrinsic device of FIG. 3 is shown to have an isolating silicon groove 32, formed into the top surface 33 of a slab or wafer of intrinsic semiconductor material 31 (FIG. 3a). This is followed by downward n-type diffusion from the newly grooved surface 32 to produce: 1) the n-type diffused region 35; 2) an upward p-type diffusion from the planar bottom substrate surface 34 to produce the p-type diffused region 36; 3) the newly formed PN junction region 37 surrounded on all its periphery by isolating intrinsic silicon; and 4) the remaining intrinsic isolating slab 31.

Figure 3B:
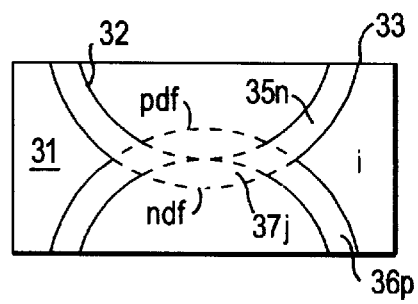

The same slab may be alignedly grooved on both the top and bottom curved surfaces 33 and 34, respectively (FIG. 3b). Next, n-type and p-type dopants are diffused in, from the new top and bottom surfaces, 32 and 34, respectively. The result is a top n-type layer 35, a bottom p-type diffused layer 36, an intermediate striped or pan-cake type PN junction region 37, and the remaining intrinsic isolating material 31.

In both FIGS. 3a and 3b, the PN junction region is formed well inside the slab and is completely surrounded by and buried in the electronically inert material 31, without ever being contaminated by atomic or micron-sized dust particles. The same PN junction region can be planar or curved, depending on the shape of the isolating groove and surface concentration of the diffusing n-type and p-type dopants and diffusing times. See application Ser. Nos. 08/483,937 and 08/483,938.

Specifically, in the device of 3a, the downward diffusion of the n-type dopant from the grooved, top cylindrical surface 32 forms in the inert "intrinsic silicon" material 31 a n-type diffusional front (ndf) shown in a broken line in FIG. 3a. This diffusion front is generally concentric with the cylindrical grooved surface 32. The upward diffusion of the p-type dopant from the planar bottom major surface 34 in FIG. 3a forms a generally horizontal and planar p-type diffusional front (pdf) also in a broken line. This p-type diffusional front (pdf) is also shown as broken straight line, parallel to the planar bottom substrate major surface 34. The PN junction region 37 must form where n-type and p-type dopant concentrations in the initially intrinsic wafer are substantially equal, below the generally planar p-type diffusional front but above the generally cylindrical n-type diffusional front. The PN junction region must be curved because the cylindrical n-type diffusion front 35, fixed at its left and right terminalting at equally n-type and p-type doped points in the vertical cross-sectional curve of FIG. 3a, is merely pushed up and flattened by its interaction with the planar p-type diffusional front. Because of the flattening, the PN junction now is flatter than the original n-type cylindrical diffusion front, i.e., having a larger radius of curvature than the cylindrical front, because of the flattening p-type dopant diffusion.

The PN junction region in FIG. 3a has a tiny and flat central horizontal portion that continuously extends sidewise and monotonically curves up from the central horizontal portion. This is so because both the n-type and p-type curved diffusional fronts have horizontal tangents at their respective central flat central horizontal portions. This sidewise extension terminates at its right edge portion to have a substantially positive slope in a first quadrant, and also at its left edge portion to have a comparably substantial but negative slope in a second quadrant.

The p-type diffused material from the substrate has a planar p-type diffusional front (pdf) parallel to the bottom major surface 34 of the intrinsic device shown in FIG. 3a. In a first cross-sectional plane oriented normally of the bottom major surface 34, a left part and a right part of the PN junction region 37 are nonplanar, and substantially symmetrical to each other with respect to another cross-sectional plane oriented normally of both the bottom major surface and the first cross-sectional plane. The left part and a right part of the PN junction region 37 has both a curved top surface and a curved bottom surface. Each set of the two top or bottom curved surfaces are symmetrical to each other with respect to another vertical cross-sectional plane.

Also, in the first vertical cross-sectional plane, a left part and a right part of each of the p-type diffused material 36, n-type diffused material 35, and undiffused, still intrinsic material 31 have prespecified varying thicknesses are substantially symmetrical to each other with respect to a second vertical cross-sectional plane normally of both the major bottom surface 34 and the vertical cross-sectional plane. In addition, both the top and bottom major surface of the n-type diffused material 32 and 35 respectively, the top major surface of the p-type diffused material 36, and the top and bottom major surface of the PN junction region 37 are all curved in the respective entire portions thereof. The device of FIG. 3b has quite similar but not exactly the same features as to the n-type and p-type materials, the remaining intrinsic semiconductor 31, and the PN junction region 37.

For forming the new gate layer of this invention, a laser system can be used. The integrated circuit device of FIG. 4 has a p-type silicon substrate 41, on which there are adjacent but laterally spaced-apart n-type silicon pockets 42. PN junction regions 43 are formed where the n-type semiconductor pockets 42 contact the p-type substrate 41. Two adjacent silicon pockets 42, respectively a source and a drain regions, are laterally spaced apart by a prespecified gate length (e.g., 10–100 nm) on a top surface of the substrate in a gate area. For extreme dynamic resistance, both the substrate 41 and pockets 42 may be nearly intrinsic silicon material, respectively slightly p and n-type doped. The gate area has a length roughly the same as, but slightly greater than, the prespecified gate length to minimize leakage. In one embodiment, the gate layer can be an oxide/nitride or even an intrinsic silicon material. This intrinsic material can be an equally n-type and p-type doped silicon leaving few uncompensated dopants producing a electrically inert silicon material.

Figure 4:
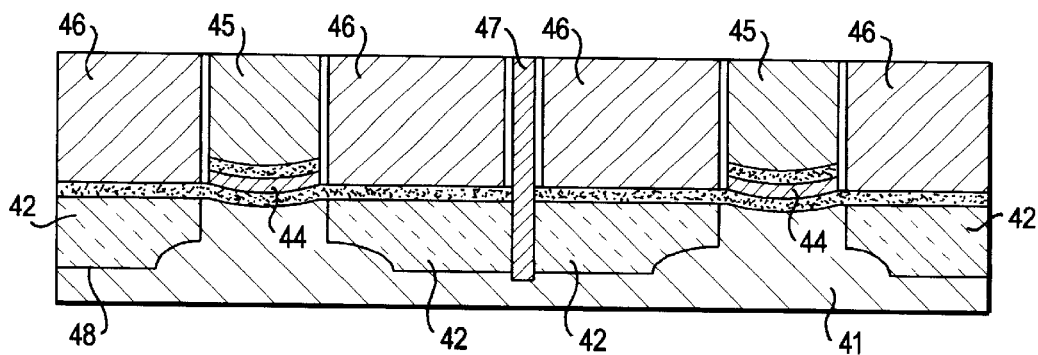
FIG. 4 is a vertical cross-section of a new MOS or CIS device having an extremely thin curved gate or field layer.

FIG. 4 also shows gate layer 44 below conductive gate lead 45.

The gate layer 44 may be formed with such a material in such a structure as to be sufficiently yieldable or flexible to minimize effects thereon of thermal mismatch stresses between varying materials of the contacting substrate, pockets, and gate lead. This design significantly improves the performance and reliability of the semiconductor circuit device. With this improved gate layer, the useful life of the old silicon dioxide/nitride material may be extended further into smaller devices.

A pulsed laser system may be used to form this gate insulating layer of an intrinsic silicon. One may use, for example, a 1.5-KW carbon dioxide laser from Convergent Energy, a Q-switched 10-W system from Spectra Physics, or a 3.9 kW to 400-W-average pulsed Nd:YAG laser from Lumonics. The gate layer 44 of the substantially electrically insulating, intrinsic silicon material is centered on the gate area, as shown in FIG. 4, but laterally extending slightly past edges of the pockets to prevent leakage.

The critical gate layer of the transistor should, of course, be as perfect and tenaciously attached to the substrate as is possible and practical. With the conventional straight gate layer design, neither perfection nor tenacity is possible. When a very thin, flat, and imperfect gate layer 44 of material A (e.g., SiO2) is attached to a flat, much thicker substrate 41 material B (Si), the thin, imperfect gate material A always fails when the transistor is thermally cycled due to repeated switch-on and off. This is so regardless of any practical combinations of materials A and B, and generally regardless of how the two materials are formed. Material B is simply too thick compared to the much thinner and therefore more fragile and defective material A so that the same inevitable thermal mismatch stress simultaneously applied onto both materials always fails the much thinner and more defective material A, and not B. The thin gate material A will fracture into many small pieces. A thicker flat gate layer of the same material A, if inadequately chemically or metallurgically bonded and not simply physically attached to material B, still fails by peeling or flaking off as larger pieces. These universal failure modes have been repeatedly observed in the semiconductor and other industries.

Four solutions to this combined thermal and thickness mismatch problem are possible:
1) selecting materials A and B to be as close in chemical composition as possible minimizing differences in thermal coefficients of expansion in the first place;
2) using a gate or field layer material so thin and flexible as to yield and relieve mismatch strains and stresses;
3) forming a curved gate or field layer material which minimizes thermal mismatch stresses through curvature-related stress-relieving mechanisms explained elsewhere and also to be explained shortly; and 4) perfectly chemically or metallurgically bonding materials A and B. This invention uses all these four methods.

Solution (1) is self-evident. Solution (3) will be more fully explained shortly in the formation of the new field insulation layer. For solution (4), please refer to with reference to U.S. Pat. No. 5,874,175. This patent discloses techniques to perfectly and strongly bond two materials with widely different coefficients of thermal expansion, even over substantial or large areas and with very thin bonding layers. To understand solution (2), one should briefly review interaction forces between two neighboring atoms. According to the commonly used Leonard-Jones atomic model, the forces between two neighboring atoms have two superimposed force components: a far-field attractive force which increases with the sixth power of the distance between the atoms, and a near-field repulsive force which increases with the twelfth power of the distance between the atoms. When the two atoms are far apart, repulsion is negligible. When nearby, repulsion is predominant. When the atoms are in equilibrium, the attractive and repulsive forces must be equal to a common equilibrium force.

According to this atomic model, an atomic chain or sheet a few Angstroms in diameter or thickness for silicon can easily bend or flex enough to accommodate any thermal mismatch strain. The bending occurs when one or both atoms simply rotate around its neighbor without changing the distance therebetween. There is therefore no work done or energy consumed, since both the repulsion and attractive forces depend only on the interatomic distance, which is constant. Nor are there any gain or loss of energy, due to either the attractive force or the repulsive force component. This has been observed even in "brittle" materials such as oxide ceramics.

Note that the attractive and repulsive forces decrease continuously, not abruptly. There should be no abrupt breaks or failures in the atomic chain or sheet as we usually see on the conventional stress-strain testing curves. The abruptness results from force interactions among billions or more atoms. To bend a wire or sheet of only 0.1 mm thick, for example, an atom at the center of the wire or sheet may, if free, still rotate around its nearest neighbors with little strain, stress, or work done. But the atom at the periphery is spaced some 100,000 atoms away from the central atom or atoms. The strains at the peripheral atoms, multiplied by the Young's modulus, are much greater than any tensile, shear, or even compression strength of the material. Also, about 10 to the $11^{th}$ power atoms must be simultaneously involved requiring extensive plastic deformation work and energy loss.

What happens if one or more atoms in the chain or sheet, such as those special cross-hatched impurity atoms 66, are of a material different from those of the other semiconducting Si or Ge atoms 65 of the chain or sheet, or other molecules of the chain or sheet such as GaAs, InP, GeSi. This depends, of course, on the properties of the special and other atoms in the chain, especially their comparative electrically resistivity types or values. Consider the simplest atomic chain 61, if the impurity atoms 66 differ in resistivity values from the other atoms by one or two orders of magnitude, or is metal-like or semiconductor-like, a new thin film solid-state device or circuit device, with film layer thicknesses ranging from several submicrons down to several atomic thicknesses, then results. Such device may be single electron or single hole device, for reasons shown below.

Figure 6:
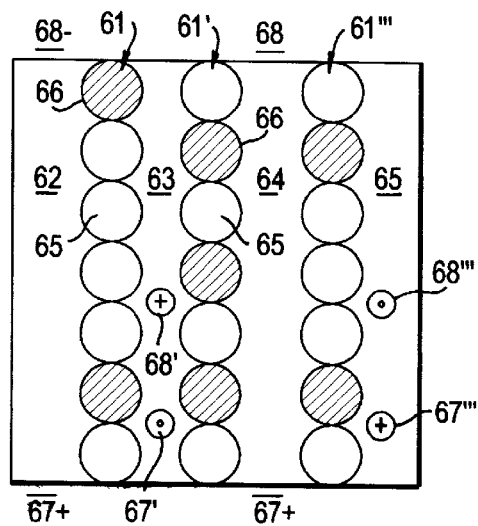
FIG. 6 is an atomic or molecular chain or sheet used in flexible 3-D atomic diode or transistor array or circuit.

As shown in FIG. 6, the insulating chain or sheet 61, 61', 61", . . . of intrinsic silicon or oxide (nitride, or other solid state material) has mostly silicon atoms or oxide molecules 65 (in white), but still has some hatched atoms made of, e.g., P, Sb, Al or B atoms 66. The atomic oxide chain or sheet, from submicrons to several or even one single atomic layer in thicknesses, should form, if perfect, a good insulating region or wall 61, 61', or 61". If the left side 62 of the chain is of the p-type material while the right side 63 is of the n-type material, an impurity atom 66 of either type will then form an atomic diode.

Any n-type impurity atom 66 with five electrons present on the chain 61 will join the n-side semiconductor material 63 to become a part thereof. The oxide isolating wall 61 electrically isolates the left p-side 62 from the right n-side 63, except where the impurity atom 66 is located forming at an atomic PN junction region and a selective leakage path. The p-type region 62 has an external positive electrode 67 at the bottom of the region and an external negative electrode 68 at the top. The n-type region 63 has a negative electrode 67' at the back and a positive electrode 68' at the front. An external electrical field is thus produced in the regions 63 causing the holes to drift backward in region 63, and the electrons frontward in the same region.

When a light beam, such as from a laser beam, shines on the p-type material 62, an electron-hole pair of carriers is locally generated in region 62 due to photon injection from, e.g., a laser diode. A laser diode can produce a ray of light at a precise wavelength and can modulate the amplitude of the light at very high frequencies without distortion by using a special optical fiber capable of lazing at the same wavelength.

Of the photon-generated hole and electron, the electron will be instantly recombined with a hole right where it is generated in the p-type region 62. The hole lost by this recombination is replenished by the bottom positive electrode 67, supplying the hole needed to maintain charge neutrality in the region 62 and creating a first electrical signal. The freed hole from the electron-hole pair will then: a) drift vertically upward or downward through the field 57–58 to the nearest impurity atom 66, b) be pushed rightward by the PN junction field through the impurity atom 66 and the PN junction into the n-type region 63, c) instantly recombines with an electron in the electron-dominant n-type region 63, and d) causes the back negative electrode 67' to supply a needed electron to the region 63 for maintaining charge neutrality in the region, creating a second electrical signal. The movement of the freed hole through the atomic PN junction at the impurity atom 66 and the supply for the lost electron by electrode 67' are done one at a time. Hence the name single-carrier (hole or electron) semiconductor device.

The externally applied electrical fields from the external electrode pairs 67–68 and 67'–68', and the mobilities of holes and electrons in silicon are known. The distances of carrier travels are related to the designed device structure of the insulating atoms 65 and the specified distribution of the impurities atoms 66 on the chain or sheet 61. Hence, the first electrical signal representing replenishing the lost hole in the p-type region 62 and the second electrical signal representing replenishing the lost electron in the n-type region 63 have predictable time delays after the laser photon impacts on the device to generate the electron-hole pair. These delay times can also be computer simulated or actually sample or model tested. The device of FIG. 6 thus is a useful opto-electrical device for monitoring, e.g., laser photon injections as to their exact locations, times, vertical and horizontal or front and back) distances on the insulating chain or sheet, and frequency of photon injections and carrier pair generations.

Decreasing the thickness of the p-type layer 62 and lower the light aiming point on region 62 increases the sensitivity and reduces the delay time of the first electrical signal after the laser injection. Maximum sensitivity and minimum delay time of the first electrical signal in region 62 are obtained with minimum thickness of the p-type semiconductor layer 62, which is shown as continuous white vertical area in FIG. 6 but actually is filled with one to several vertical columns of the insulating semiconductor atoms 65. Maximum sensitivity of the second electrical signal in the n-type region 63 is achieved with a minimum distance the photon-generated carriers must travel before getting through the gate at the impurity atom 66. Regulating the thickness of region 62 thus also changes the sensitivity of the this optical reading, light sensing device. Monitoring the first electrical signal alone provides a one-dimensional light sensing device for the vertical direction.

Maximum sensitivity and minimum delay time for the second electrical signal requires the minimum thickness of the n-type layer 63 but a laser aiming point on region 62 closest to the negative electrode on the back of the region 63. The thickness of layer 62 can also be changed to regulate the sensitivity of the second electrical signal on the device if the photons strike only on the p-type layer 62. Monitoring the second electrical signal alone provides a one-dimensional light sensing device for the horizontal direction from the front to the back surfaces. Hence, monitoring both the first and second electrical signals provides a two-dimensional light sensing device for both the vertical and horizontal directions.

The impact of a single photon on the device generates at least two complementary electrical signals even in single semiconductor chain or panel such as 61, 61', 61", and 61'". These two signals confirm each other greatly enhancing the accuracy and reliability of the monitored results. This is especially important in telecommunication where no error is tolerable whether handling data, sound, or image.

If the light first strikes into the n-type region 63, similar reasoning apples with the following two exceptions: 1) of the photon-generated electron-hole pair, the hole is instantly recombined in situ with the closest electron abundantly supplied in the n-type region 63. The freed hole cannot move leftward into region 62 because of the reversed PN junction at the impurity atom 66, and must move rightward into region 64; and 2) the external positive electrode 67' is at the front of the region, while the external negative electrode 68' is at the back of the region 63, so that the freed electrons drift frontward while the freed holes drift backward in region 63.

The device of FIG. 6 has a next-to-the-bottom row of three impurity atoms 66. These three impurity atoms 66 and the intervening semiconductor material 62, 63, 64, and 65, alone, can already form a one-dimensional light-monitoring device, for horizontal light monitoring as shown, or for vertical light monitoring if the device is turned 90 degrees so that the three impurity atoms 66 are aligned vertically rather than horizontally.

A diode can also be formed if the impurity atoms 66 are, instead of being n-type, p-type having only three electrons on each atom. Similar reasoning for the operational performance of the device used above also applies here.

If both sides 62 and 63 are of the same type, such as p-type, while the impurity atom 66 is of the opposite type, e.g., an n-type dopants with an five electrons (or an extra electron) per atom, then a pnp transistor forms.

As an optical reader, the device of FIG. 6 has sensor components each having a size comparable to the side of two dopant atom 66, one for forming the PN junction and the other for insulation. Each sensor component then has a size of the order of 5 Angstroms. The thin, flexible optical reader panel therefore has about 2,000×2,000=4,000,000 pixels per square micron. A one-micron optical fiber fully used will also have a capacity of 4,000,000 pixels. A one-micron optical fiber having a square array area of 0.707×0.707=0.5 square microns in cross-sectonal area may still contain up to 2 million atomic light detectors. These optoelectrical devices are specially suited for modern optical telecommunications.

Replacing the impurity atom 66 by a semiconductor such as Ge—Si, InP, GaAs, diamond, SiC, ferromagnetic, piezoelectric, or ceramic superconductor molecules, not atoms, provides totally new generations of solid state devices of possibly far superior device performance and capability.

Photons striking from the left of the device generate hole-electron pairs which travel the least distances in region 62 when collected by electrode 67–68. The same carriers have to suffer transmission losses through silicon and oxide or dopant atoms before their collections. One transmission loss is suffered for collections by electrode 67–68, two for collections by electrode 67"–68', three times for collections by electrode 67"–68", and so on. Devices with more than four layers or regions 62–63–64–65 are possible. The photon from laser or any light may also strike the device in all directions and not necessarily horizontally from the left only. Still, the 1-D, 2-D, and 3-D light-monitoring devices are equally useful because all the variables including dimensions, impact angles, distances are known or predetermined.

Li's U.S. Pat. No. 4,690,714 also gives 3-D optoelectrical devices. But the '714 and this invention are patentably different because: 1) the '714 devices generally have component sizes of 1 or 2 microns, or orders of magnitude larger; 2) The photon-generated carriers are pushed through the impurity atom 56 to be monitored not one at a time, as in the device of this invention; 3) While it is possible in the devices of the '714 patent to be smaller than 1 or 2 microns by, e.g., splat cooling, the smaller components would lose size and shape uniformity and even crystallinity, becoming practically useless; and 4) The location and size of the components are not accurate to fractional microns, and certainly not atomic sizes.

Figure 2:
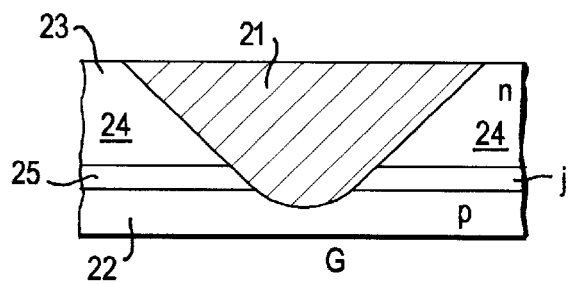
FIG. 2 shows partial vertical cross-section of Li's prior-art isoplanar device with a round-bottomed and sloping, curve-sided oxide isolating groove.

As shown above, the gate layer is the most critical part of the MOS or CIS device. Further, serious problems still exist. Some of the prior patented techniques are useful here to improve the new gate layer. Specifically, Li in U.S. Pat. Nos. 3,430,109 and 3,585,714 disclosed that a rounded or curved insulating oxide material groove (FIG. 2) lessens the splitting forces on the neighboring silicon material because the insulating oxide material has a blunt, rather than a sharp tip or bottom. There is no notch effect. A centrally rounded silicon pocket thus lessens the splitting forces on the neighboring silicon oxide material by, among other things, eliminating the notch effect.

With rounding, the mismatch stresses and strains between silicon and other conductive contacting metals, and the adjacent insulating oxide or other gate layer vary more gradually, not abruptly, near the rounded or curved bottom, due to curvature effects. These stresses are smaller on a curved adjoining surface than on a flat adjoining surface.

When material A is attached, or joined, to a material B at a flat interface, severe interfacial mismatch stresses and strains always exist due to temperature, dynamic condition, or volume changes in in-situ compound formation. Failures are then likely or possible due to, for example, deboning of materials, poor or loss of electrical contact, fracturing of the thinner and weaker material into many pieces, and peeling of the thinner and weaker material. With flat interfaces, no mechanisms exist to relieve or reduce the mismatch stresses.

The situation is different with a rounded interface. Rounding provides one or more mechanisms of stress relief. Being very close to critical PN junction regions, a flat bottom of the oxide insulating groove often causes mechanical and subsequent electrical failures. With a rounded bottom interface having zero bottom width, the stresses and strains are zero in the lateral direction at the zero-width bottom. Also, stresses and strains are minimum and symmetrically distributed when the rounded bottom is symmetrical with respect to a longitudinal bisecting plane thereof. Symmetrical stress and strain distribution insures that failure can equally occur on either side. That is, there is no weaker side so that the entire device is stronger overall.

The new gate layer of the invention can be formed by laser fusion. The layer must have blunt and curved or rounded edges, with smooth surfaces due to atomic forces exhibited as surface tension. As shown below, fusion and solidification maximizes chemical purity, mechanical strength, crystallographic perfection, and even oriented grains for maximum strength and thermal or electrical conductance in a preferred direction. The laser remelted and resolidified gate or field layer is an extremely thin layer with a smooth bottom surface and no rough edges. It should be curved according to this invention. It may have a constant thickness across its lateral dimensions, to terminate at zero thickness at its peripheral edges. The new gate layer has a horizontal, rounded oxide bottom. The thermal mismatch stresses and strains normally of the gate layer must also be zero at the gate periphery. The new gate layer is not flat, but curved like a soft pancake in a bowl. The mismatch stresses and strains are smaller on the curved pancake surface than if the pancake were flat. The horizontal mismatch stresses and strains at the rounded bottom of the gate layer must also be zero, because the pancake gate layer has zero bottom width at its center. Further, these stresses and strains are symmetrical with respect to any vertical cross-sectional plane centrally bisecting the pancake gate layer.

Instead of being laser-formed, the gate layer may be a thermally grown-in oxide or nitride, an ion-implanted oxide or nitride; an ion-implanted intrinsic semiconductor gate layer of Si, Ge, GaAs, InP, SiGe, or other semiconductor gate layer with very few uncompensated dopants to thereby behave like an intrinsic semiconductor layer or at least an substantially insulating layer relative to the p-type substrate and n-type or n-type pockets. But thermal oxide growth provides no atomic surface-smoothing by liquid surface tension, nor material purification by melt freezing or zone melting. Still, these thermally grown oxide or nitride layers are not only relatively electronically inert and insulating to make useful CIS devices, but also are unetched, uncut, and otherwise similarly unmodified. This condition preserves the as-formed metallurgical continuity. Metallurgical continuity or, even better, microscopically perfect and continuous, graded bonding of the new gate layer to a substrate below and the gate metal lead above giving perfect device structure, continuity, and repeatability. "Microscopically perfect bonding" means that the components of silicon and its oxide or nitride are bonded with a substantially 100% dense, bonding region which is metallurgically defect-free, i.e., with no visible microcracks even at 1,000 magnification.

The "Ceramic Composite" U.S. Pat. No. 5,874,175 discloses various ceramic bonding techniques to bond dissimilar materials including oxidized metals and ceramics. The methods can handle highly mismatched materials over substantial or large sizes. Miniaturized semiconductor circuits by definition are small in sizes. But here extremely high reliability and zero defects must be insured. In air, silicon is known to immediately form an oxidized surface layer of about 18 Angstroms in thickness. The disclosed techniques can produce reliable but sub-micron thin bonding layers to metals or ceramics, enhancing device and interconnect miniaturization. Properly done, the bond strength can even be more than both of the two bonded materials. Generally, metals are the stronger material, while ceramics, oxides, or intermetallics such as silicides the weaker materials. However, with selected bonding techniques, the weaker materials can be surface-strengthened to be even stronger than the unbonded material itself.

These dissimilar material bonds are metallurgically perfect, without voids, cracks, and other crack-initiating defects visible at 1,000× magnification. These bonds can, if needed, also selectively withstand 500, 630, 800, or 950 degrees Centigrade. These temperatures are sufficient for the bonded assemblies to withstand any subsequent device processing procedures or service requirements, even for SiC or diamond devices. These bonded material regions are different in structure, mode of operation, and results from the usual chemical or physical deposits, filled-in organics, and flowed-on polymers, and spinned-on or painted-on oxides. In these later materials, there is inadequate, or even little, atom-to-atom fusion or liquid diffusion bonds which make the deposits very strong.

The above techniques for forming the gate layer can also be used for other parts of the CIS device. For example, extremely thin, curved field layers of COS devices can be similarly formed by, e.g., laser, to electrically isolate one semiconductor region to another. This will be disclosed in more detail later.

Besides mechanical strength problems, a non-perfectly bonded material layer with voids and microcracks gives problems of high boron penetration and leakage current, low breakdown voltage, and poor device performance, reproducibility, yield, reliability, and resistance to the ambient particularly as to moisture. The importance of perfect materials bonding in microelectronics is thus evident.

As indicated above, a flat, very thin gate layer can not remain perfect after bonding, particularly after improve perfect bonding, when subjected to any significant stresses and strains. The flat surface provides no stress or strain-relief mechanism, and the very thin layer has little strength to withstand even minimal thermal, dynamic, or volume change mismatch stresses. The very thin flat layer must fracture into many pieces destroying not only its mechanical integrity but its useful electrical utility. The curvature here is necessary to provide a number of stress-relief mechanisms. Such a curved gate layer can be provided in the same laser processing step, as shown below.

Proper bonding of the gate layer to the substrate below and metal lead above insures stable and reliable electrical contacts. A gate layer perfectly bonded to the substrate alone is not sufficient. The gate layer must also be prepared by a proper metallizing on its top surface for its perfect bonding to a conductive gate electrode. A conductive gate electrode formed of an electrically conducting material is generally centered on the gate area to control flow of electronic carriers from one of the two semiconductor pockets to the other, i.e., from source to the drain. The top bonding of the gate layer is as equally important as the bottom bonding. The above-mentioned U.S. Pat. No. 5,874,175 bonding patent pays particular attention to microengineering the oxide-silicon interface to achieve mechanical and electrical perfection and thermochemical stability. In this way, the bonding strength does not decrease with time during service, as generally observed. High interfacial perfection not only enhances mechanical and thermochemical stability, but also device performance including enhanced dielectric constants.

Useful interface microengineering techniques disclosed in the '175 patent include: replace failure-initiating oxide or silicon surface voids and microcracks with mechanical, thermal, and electrical strengthens; material purification and dielectric enhancement, grain refinement and preferential orientation to facilitate thermal and electrical conduction, and functional composition grading to meet a specific service requirement.

Unidirectional cooling can produce, if needed, columnar grain growth. The anisotropic grains in the bonded regions are highly beneficial to achieve bonds with preferred direction of mechanical strength and thermal or electrical conductivity. The bonded regions then have refined, purified, and burned-in gate layer materials with unique and repeatable mechanical and electrical properties. The uniformity results because the columnar grain growth is from a liquid melt in which materials diffuse at a liquid diffusion rate of about 0.0001 cmxcm/sec or about 10 orders of magnitude larger than solid-state diffusion rates. Chemical composition or composition profiling, grain sizes, and mechanical properties are therefore more reproducible. Further, a unidirectional cooling and freezing in a direction normally of the gate layer takes place, and the dielectric material is purified according to William Pfann's unidirectional temperature-gradient zone melting process (Wiley, New York about 1950), as shown elsewhere. This zone-melting process achieves at least an order of magnitude in material purity.

Controlled freezing from the melt according to the alloy phase diagram achieves additionally orders of magnitude in purification based on the segregation coefficient on the relevant alloy phase diagram, as shown immediately below. A silicon melt containing either Fe or Co, for example, has a segregation coefficient of only 0.000,008. The silicon layer is therefore purified by over 125,000 times by simply directionally freezing only once, or by over 15,600,000,000 times by directionally freezing twice. Similar purification results if the silicon dioxide layer is temperature-gradient zone purified, and the vastly improved dielectric constant on rapid laser heating followed by directional freezing.

Proper melting and freezing is by far the fastest, simplest, and most cost-effective way to produce high-yielding, highquality semiconductor devices. It is not coincidental that years ago the best transistors and diodes are made only by melt growth processes.

Applied to the gate layer formation, the melt growth process of the present invention also is the simplest, fastest, and most cost-effective method of producing high-quality gate layers. Most specifically, the new gate layer material can be the purest, most defect-free, crystallographically perfect, uniform, with the thinnest but strongest grain or subgrain boundaries, and the exact desired dielectric constant. The subgrains can be substantially uniform in width or size and length.

In integrated circuit manufacturing, the more complicated the device materials and production process, the lower the yield and the higher the final cost. Also, to achieve submicron accuracy, thermal expansion and contraction must be controlled and compensated in all directions. During the over hundred of integrated circuit processing steps including the critical gate placement, oxide formation or reflow, and cooling, the more and less pure the device materials, and the more and complicated processing steps, the inferior the device qualities and yield.

The formation of the new gate layer, particularly with a laser, gives at last a multiple of the following important features:

1) The laser heating melts the gate layer material and smooths the top and the more critical bottom surfaces by an atomic surface-smoothing mechanism, i.e., atomic surface tension forces applied on a free melt surface unconstrained by rough solid surfaces. This achieves minimum roughness on both the top and bottom dielectric surfaces. As shown above, a thin, smooth gate dielectric surface with very small channel length leads to improved transistor performance. Since Si and SiO2 differ significantly in thermal conductivity and surface reflectivity, a laser heating process can be designed as to pulse speed, power, and duration to melt a surface layer of SiO2 without significantly affecting the underneath silicon substrate;

2) Solidification of the molten gate layer material, sublayer by sub-layer, from the bottom surface up purifies the gate layer material not only greatly reducing impurities, inclusions, stresses, defects, but improving insulation, mostly and precisely at the critical bottom surface facing the substrate. As shown, the first solidified sub-layer, closest to the substrate, has the most purified dielectric material. For example, Fe, Co, Zn, Au, Cu, In, Bi, Ga, Al, As, Sb, Li, and B respectively have distribution coefficients in freezing silicon of 0.000008, 0.000008, 0.00001, 0.000025, 0.0004, 0.0004, 0.0007, 0.0080, 0.002, 0.023, 0.3, 0.01, and 0.8, according to CRC Handbook of Applied Engineering Science, Ed. R. E. Bolz and G. L. Tuve, Cleveland Ohio 1970, pp 206–207. The purification factors for this list of elements are, respectively, 125,000, 125,000, 100,000, 40,000, 2,500, 2,500, 1,428, 1,250, 500, 43.5, 3.33, and 1.25. Except for p-type dopants As, Sb, and B, a single freezing purification is generally sufficient. If not, the process may be repeated by pulse heating the resolidified layer to purify a second time achieving combined purification factors of up to 15,625,000,000 times. Even a third or more time of freezing purification may be applied, especially with intrinsic silicon containing low-segregating dopants As, Sb, and B;

3) While molten by laser heating, the gate layer material may be removed by laser evaporation or sputtering, leaving a very thin melt layer (e.g., 0.1 micron down to 1–2 atomic layers) of zone-refined material of, e.g., pure SiO2 with very high dielectric constant, to freeze into a concavely curved depression when looked from the top, with a thin, matchingly curved gate dielectric layer thereon. This zone-refined and purified curved gate layer has exceptional bottom smoothness and minimum microcracks, voids, inclusion, and stresses. As shown, the curvature minimizes mismatch strains and stresses due to thermal expansion, density differences, or volume expansion to form SiO2 from Silicon;

4) Microsecond, nanosecond, picosecond, or even femtosecond pulsed laser heating instantly heats up a very superficial top layer which splat or nearly splat cools the bottom surface of the molten layer with extremely short solidification cycle. Such fast solidification gives very little time for grain growth. Extremely fine grains with minimal grain boundary thickness therefore result. The fine grains again produce the desirable, smooth gate dielectric facing the substrate. Note that the laser pulse heating is so fast that it can heat up and melt refractory oxide (e.g., SiO2 melting above 1300 C.) without melting or damaging the dopant diffusion profiles in the substrate silicon;

5) The laser or other auxiliary heating can be automatically feed-back controlled, so that the molten material freezes into solidified elongated grains or even single crystallites. These crystallites consist of extremely purified dielectric material of, e.g., SiO2, and have very thin, mechanically perfect grain or subgrain boundaries forming excellent gate layer materials. Following the direction of heat extraction, cooling from the heating can be unidirectional normally of the local bottom gate layer surface. These conditions produce excellent dielectric grains oriented in an ideal direction for maximum thermal and electrical conduction through the gate layer;

6) By flexing, the thin curved gate layer eliminates thermal and dynamic mismatch stresses and strains providing a perfect gate layer without microcracks which cause unwanted instabilities, leakage currents, and boron penetrations; and 7) The laser heating produces a molten gate material which promotes a metallurgical bond, continuously across the entire contact interface, without insulating voids or microcracks visible at a magnification of over 1000 times. Such good bonds insure that the gate layer sticks to, or stays in place onto, the substrate. guaranteeing reliably good electrical contacts. As shown elsewhere, melt growth purifies and strengthens materials, forms crystals of uniform shapes, sizes, and heights, and even with very good crystallinity and microstructure. In fact, each of the melt-grown grains may be a perfect single crystallites with controllable orientation for specific electrical, thermal, optical, or other purposes. The bonding of the gate layer to the substrate generates a wide, liquid-diffusion graded bonding interfacial region therebetween to reduce the thermal stress gradient across the interfacial region thereby minimizing stress-induced carrier mobilities changes. A more perfect bonding is possible by using a solution metallizing and bonding method given in, e.g., U.S. Pat. No. 5,874,175, without appreciably increasing the gate layer thickness. The solution metallizing method has already been successful to join practically all ceramics including: silicon dioxide, silicon nitride, silicon carbide, and diamond. A perfectly bonded gate layer enhances the circuit yield, performance, stability, reliability, and life.

Gate layers on present MOS devices are already quite useful, except as to reliability and reproducibility in very fine devices. Hence, not all the above seven beneficial qualities produced by the new laser processing method, i.e., atomically surface-smoothed, purified material, extremely thin gate layer; grain-refinement, flexibility, and perfectly bonded, need all be present on a give device. In any case, one should use as few processing steps as possible if fairly good yield is already obtained with one or two new features of the invention.

Other material processing methods may also be used instead of laser. For example, focused electron beam may be used for the heating. Laser, electron, and other energetic argon particle bombardment may be used to remove material for forming the depression with curved walls. Chemical-mechanical polishing (CMP) methods are also useful to form the curved depressions or to produce extremely thin gate layers. Ion implantation can produce ultra-fine regions of insulating, conducting, and semiconducting materials even inside the semiconductor. In particular, multiple ion-implantation steps may be employed to introduce p-type or n-type dopants, oxygen, nitrogen, and other foreign atoms precisely into the silicon substrate. The required implanting voltage may vary from 1 megavolt, 100 kilovolts, 10 kilovolts, to less than 1 kilovolt. Under an implanting voltage of one megavolt, oxygen and nitrogen can be introduced into silicon host to a depth of 1.7+/−0.13 and 1.87+/−0.12 microns, respectively. That is, accuracy of the implanting depth was already less than about 0.13 microns some 30 years ago.

Properly focusing the laser beam can be 20–40% smaller than gate gap width but still with enough power to remove the molten gate layer material produces a concave (looking from the top) groove or depression covered with precisely the required amount of very thin gate layer material of 3–40 Angstroms. It has been found that neutralizing many of the photons in the laser beam facilitates the focusing to a smaller size. Similarly, ion beams may be neutralized by electrons to achieve similar results.

Precision silicon removal by laser achieve two unique effects: a) thin layers of even brittle ceramic materials such as silicon dioxide, become flexible and can tolerate much greater thermal mismatch stresses and strains with microcracking or void formation, maintaining the exacting desired properties of the gate layer material; and b) a concave curved groove surface can resist thermal mismatch stresses by neutralizing the mismatch strains, through a curvature-related stress-relieving effect as shown above.

A rounded insulating gate material groove lessens the splitting forces on the underneath silicon substrate layer because the groove bottom has a blunt, rather than a sharp tip or bottom. There is therefore no notch effect. The mismatch stresses between silicon and the insulating gate layer vary gradually, not abruptly, near the rounded bottom where the PN junction is, due to curvature effects These stresses are smaller on a curved adjoining surface than on a flat adjoining surface. In particular, the stresses are zero in the lateral direction at the bottom if the bottom has a zero width, and minimum and symmetrically distributed when the rounded bottom is symmetrical with respect to a longitudinal bisecting plane thereof. The zero bottom width and symmetrical depression shape can be met by proper laser focusing procedures.

The laser melting of the gate layer provides an atomic surface-smoothing process to achieve a liquid-smooth surface on a lower surface of the gate layer facing the substrate. When molten, the gate layer material has atomic surface tension forces on the melt surface to produce the liquid-planar, lower gate layer surface.

As shown above, the laser beam is focused to such a beam size with such a power density profile to remove a selected part of the melt material by material ejection or evaporation thereby forming a concave depression containing the remaining melt material. Rapid or splat cooling of the molten gate material produces ultra-fine solidifying grains further smoothing a lower surface of the gate layer. In addition, progressively solidifying the melt material from the bottom up purifies the solidifying the melt material, according to a phase diagram of the gate layer material. Most material purification occurs precisely at the lowest or first-to-freeze layer closest to the substrate to thereby have the best gate material properties including the highest electrical insulation properties thereat. Generally, a single melting/solidification/purification process is adequate. When needed, remelting the solidified gate material and repurifying the remelted gate material may be done to achieve further material purification for additional improvement in the electrical insulation and other properties of the gate layer. The laser melting and resolidification process also gives a gate layer material which is thoroughly aged by liquid diffusion. This gate material is fully compatible with silicon at the interface, and can tolerate further silicon processing and temperature cycling.

The focused laser beam additionally gives a curved depression designed to reduce substantially the thermal mismatch stresses through a curvature-related stress-relief mechanism. Generally, the gate layer should have a concave shape when looked from a point above the gate layer, with a radius of curvature of less than 0.5 microns or less than fifty times thickness of the gate layer.

The gate layer should be so thin as to be flexible relieve thermal mismatch stresses through flexing thereof. It should be no more than about 0.1 micron thick. One to three atomic layers may be the minimum. The gate layer should be of a size to make the gate width very small, such as less than 0.30, 0.20, or 0.10, 0.01, down to 0.001 microns, to thereby reduce the thermal mismatch stresses, which are proportional to the gate width.

In one embodiment, the gate layer has substantially the same material as materials of both the pockets and the substrate, and consists essentially of silicon, with up to less than about 10 ppm of impurities. Practically all the impurities are compensated, leaving few free electrons or holes to conduct electricity. Because of the practically the same composition, the gate layer, the substrate, the pockets, and even the gate lead all have substantially the same coefficient of thermal minimizing thermal mismatch stresses. All the essential device materials in these new devices also have practically the same density, minimizing dynamic stresses due to vibrations, impacts, and high accelerations and decelerations. This can be seen as follows: Silicon has a density of 2.33 g/cc. Dopants such as P, B, As, Sb, Al, . . . are unimportant because of their insignificant ppm or ppb ranges.

Silicon dioxide and silicon nitride have densities of 2.33 and 3.17, very close to that of silicon. But not Al, Cu, Ge, Au, Ag, Ta, Ti, Hf, W and Zr materials used for contacts and interconnects. These contact materials have densities of 2.70, 8.96, 5.32, 19.3, 10.5, 16.7, 4.54, 13.3, 18.3, and 6.51 g/cc, respectively. When the semiconductor circuit is accelerating at 1 gravity level (G), there is a differential inertia force of 2.70−2.33=0.37, 6.63, 2.99, 17.0, 8.17, 14.37, 2.17, 11.0, 17.0, and 4.14 G acting on the Si-metal assembly to break it up by tension or shear. The G-levels to cause tensile or shear failures in the silicon or silicon-metal interface can therefore be predicted by using the relevant tensile or shear strength of silicon relative to that of the particular metal.

As an example, at 10 G, both W and Au with the about same density of 19.3 are exerting on the Si—W or Si—Au interface to tear it apart with a force of 17.0×10×980=167,000 and 107,800 dynes, respectively. The bond between silicon and other contacting metals in the silicon circuit is often merely physical and very weak. Yet, this bond, which governs the performance and reliability of the integrated circuits, can easily break up on conventional circuits under the acceleration or deceleration forces. The new gate and field layers of this invention, particularly when metallized and bonded according to U.S. Pat. No. 5,874,175, uniformly or 100%, metallurgically with no voids or cracks, ensuring their permanent bonding reliably to the substrate. These new gate layers are therefore resistant to environmental conditions particularly G forces occurring during shock, impact, vibration, and rapid acceleration and deceleration.

Si (density 2.33) integrated circuits containing only intrinsic Si as insulators, semiconductors, conductors, and other essential device materials are the most resistant circuits to dynamic forces, because the components materials, Si and intrinsic Si, have practically the same density differing at most by the presence of only ppm or ppb of impurities. Si circuits containing silicon dioxide (2.334) insulators have density differences of only 0.004 g/cc or 0.172%; while Si circuits containing Al (2.70) conductors have a density difference of y less than 16%. Silicon circuits containing the nitride (3.17), Ti (4.54), Ge (5.32), and Zr (6.51) have a density difference between its component materials of less than 36.1%, 94.8%, 129%, and 180% respectively.

Using a single silicon material for the p-type pocket, ntype pocket, isolating region, gate layer and gate lead materials achieves the best dynamic mismatch stresses and strains. The resultant circuits are extremely resistant to environmental impacts, vibrations, and large or rapid accelerations and decelerations. Even using materials with densities of no more than 10, i.e., Al, Cu, Ge, Ti, Hf, and Zr, will significantly improve the device's resistance to dynamic mismatch strains and stresses over current devices.

Any dopant changes in the pockets and substrate material due to the laser processing may be corrected by ion implantation of the proper dopants such as P, Sb, As for n-type and Al and B for p-type silicon. The implanting voltage should be no more than a value selected form the group consisting of 100 kilovolts, 10 kilovolts, and 1 kilovolt. Also, instead of intrinsic silicon, doped but nearly fully compensated silicon may also be used for replacement of the gate material. In fully compensated silicon in which the n-type dopants and p-type dopants differ in dopant concentrations by no more than several ppb or less, both the electron and valence bands are nearly completely filled, allowing very few carriers to move therein providing a substantially electrically insulating material, particularly when in comparison to the p-type substrate and n-type doped pockets.

In a similar way, a new field layer electrically isolating two regions of the same or different conductivity type in an integrated circuit can also be beneficially made of a very thin, flexible electrically isolating material. Here, the semiconductor integrated circuit shown in FIG. 4 comprises: a semiconductor substrate 41 of a first conductivity type, and a semiconductor pocket 42 of the opposite conductivity type on top of the substrate thereby forming a PN junction region 48 at where the semiconductor pocket contacts the substrate. A field layer 47 of a substantially electrically insulating material is formed of a substantially constant thickness throughout its depth or height, except at its bottom where it is rounded to zero bottom thickness or width, e.g., down to one atom thick or wide as shown by the field layer 47 in FIG. 4 or 51 in FIG. 5.

The new field layer starts at a top surface of the surrounding material pockets 46, extends substantially vertically downward pass the entire semiconductor pockets 42 into the substrate 41. This field layer 47 is sufficiently long and deep to reliably divide the pocket into two separate electrically isolated regions. Together with the PN junctions, this field layer physically separates and electrically insulates the two separated and insulated regions of the pocket from each other. The field layer also has such a material in such a structure as to be sufficiently yieldable to minimize thermal mismatch stresses between various contacting materials of the substrate, separated regions in the pocket, and the field layer. In this way, the performance and reliability of the semiconductor circuit device is significantly improved. The field layer 47 or 51 may be only several atoms thick down to a single oxide molecule or intrinsic silicon atom occupying practically zero chip real estate. At least, it is hundreds or thousands of times thinner than the conventional chip-wasting oxide isolating regions, such as regions 41a through 41d in FIG. 1.

Li's prior solid-state device patents show the use of oxide isolating grooves which have zero bottom widths avoiding the flat portions on prior-art devices and enhancing device miniaturization. Except for a layer thickness of one to several atomic layers, the new field isolating layer 47 of this invention practically eliminate the entire field isolating groove or layer. This new design of the field layer thus saves much chip real estate thereby help achieving the most in device miniaturization.

Figure 5:
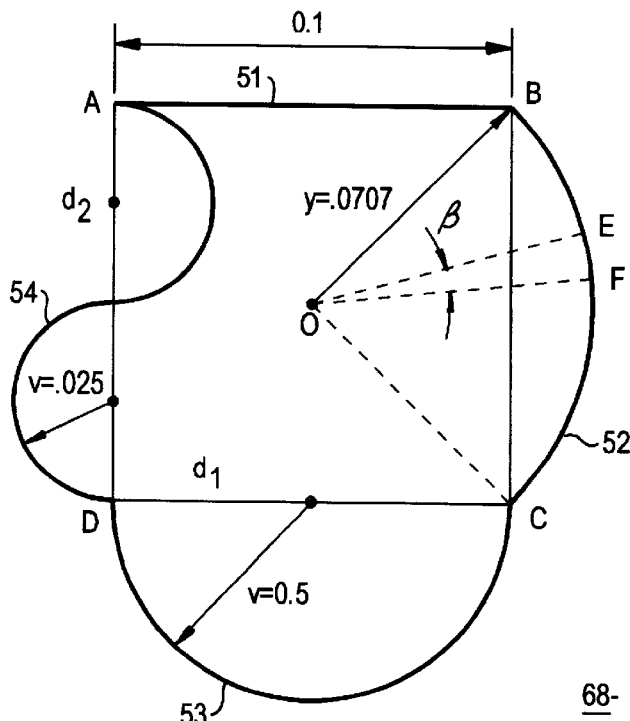
FIG. 5 shows a new MOS or CIS device showing a narrow, thin-film curved or wavy field insulating layer or wall separating the device components.

The new field layer 47 of FIG. 4 or component separating walls 51–54 in the device of FIG. 5 preferably are curved to reduce the thermal mismatch stresses through a curvature-related stress-relief mechanism. Reduced stresses maintains material integrity of the thin and fragile field layer. The field layer 61 in FIG. 6 has a thickness of 20 down to one or two atomic layers. The pocket 42 and the physically separated pocket regions have widths from 30 to 1,000 Angstroms. On a horizontal cross-sectional plane, the new field layer preferably has a single circular curve or a multiple sinusoidal curves to combat thermal mismatch stresses and strains, as shown in FIG. 5. The new field layer has a curved shape having a radius of curvature of less than 1.0 microns down to or less than 20 times the thickness of field layer. Being thin, the field layer can flex and yield to relieve applied stresses thereby maintaining its material integrity and electrical utility.

It is desirable to have a thin and flexible, curved or rounded field layer. Because of the extremely thin walls, the curvatures cannot be formed in the vertical cross-sections, but must be on a horizontal cross-section. This is shown in FIG. 5 where a top view of a square CIS of unit size, such as basically the 0.1 micron square, is shown. This device has a perimeter of multiple insulating material walls of oxide or nitride material 1 ion-implanted into, e.g., a silicon substrate of material 2.

An alternative method for forming a thin, flexible, liquid-smooth, and curved gate layer is as follows. First smooth the top surfaces of both the source and drain regions by additional precision chemical etching or CMP with automatic real-time feed back control. Dopants are very superficially implanted into these regions in very high concentrations. A very superficial top layer of each surface may be further smoothed by fast laser or microwave heating to above 1,000 degrees C. for less than several seconds, or even to the point of superficial liquidisation and liquid smoothing. Such very rapid superficial heating, applied for a very brief time particularly during heating up and cooling down, achieves additional benefits in producing the highly desired, very shallow but highly activated (or dopant-concentrated and low-resistivity) junction than a longer anneal at a lower temperature. At such high spike heating rates the common statical phase diagrams, which assume that all contacting components are always at complete thermal equilibrium, no longer apply or even relevant. New dynamic phase diagrams must be used. Dopant concentrations much greater than the thermodynamic-equilibrium values are thus obtainable distinct plus for advanced devices.

The extra thin, flexible, and curved gate layer is then formed on the very smooth top surfaces of the source and drain regions, which are heated for better bonding adhesion, cooled for cleanliness, or both. Again, very superficial heating by fast laser pulses, microwave or both, are used to heat or even melt the very bottom surface of the gate layer. Athermal shock bonding or pressurized welding of the liquid-smooth, curved gate layer onto the top surfaces, with or without the addition of microwave or laser pulse heating.

FIG. 5 shows a generally square-shaped CIS silicon device. Each device has four oxide isolating grooves or walls 51–54 to enclose the CIS device. Each of the grooves has a wall thickness of from 20 down to one or two atomic layers thick thereby occupying negligible chip real estate. Practically all the chip real estate is used for the actual circuit components. The top isolating groove or insulating wall AB 51 is a straight wall of unit length (e.g., 0.1 micron). The right circular isolating groove BC 52 consists of one-quarter of a circle of radius of 0.0707 microns (i.e., one-tenth of one over square root of 2), with an 90-degree arc giving a curved wall length of 0.178 microns. The bottom circular isolating groove or insulating wall CD 53 consists of one-half of a semi-circular wall 53 of 0.500 radius, with a 180-degree arc length of 0.157 microns. The left isolating groove or insulating wall DA 54 has two 180-degree half waves with a radius of curvature of 0.025 microns.

FIG. 5 shows two new mechanisms to relieve the unavoidable thermal mismatch strain between the silicon substrate and the square-shaped device thereon. This strain relief is due to the curvature of the insulating walls or field layers 51–54. When thermal mismatch strain occurs, the small arc length l=r×A forming part of a side of the device may change in arc length l by delta l to neutralize the strain as follows: delta l=delta®×A)=r. Delta A+A. Delta r. In the above equation, l is the arc length, r is the radius of curvature of the arc, and A is the subtended arc angle.

New mechanisms of stress and strain relief result because the arc provides mismatch strain relief by automatically changing its radius of curvature r, arc angle subtended A, arc length l, or all of these variables, i.e., delta r, delta A, and delta l. That is, at least one of the radius r, arc angle A, and arc length l can automatically change, in response to the mismatch strain, to provide a change in arc length l, i.e., delta l. These changes in delta l, r, or A must all be in such a direction, respectively positive or negative, as to reduce, but never to further intensify the thermal mismatch strain. This is because these changes merely respond to the thermal mismatch strain, and are not the cause or initiator of the thermal strain. Further, the changes in l, r, and A automatically stops when the residual mismatch strain is reduced by the changing arc so that it can be tolerated in the thin insulating oxide wall of the device.

FIG. 5 further shows that for the same unit edge dimension on each of the four sides of the square circuit component, the top straight side, 51 or AB, is the least capable of withstanding mismatch strains. Next comes the right side, 52 or BC, which has the least arc length with minimal capabilities of changing l, r, or A. The left side, 54 or DA, has the longest arc length and can best withstand the thermal mismatch strain. The two minute arcs provide more opportunities to change the six variables on l, r, or A and, finally, the mismatch strain, on this multiply curved side 54 than on singly curved sides 53 and 52.

The thermal expansion coefficient of silicon substrate is a1=0.0000027 per unit length per degree Centigrade, while that of the silicon dioxide insulating wall is a2=0.0000005 per unit length per degree Centigrade. The difference is 0.0000022 per unit length per degree Centigrade. Hence, raising or lowering the silicon CIS a mere one degree Centigrade produces a thermal strain of 0.0000022 per unit length of the component. Assuming only the Young's Modulus of silicon is operative at 16,000,000 psi because of extreme thinness of the silicon dioxide insulating layer, a 1, 100, and 300 degrees Centigrade change in temperature in a device processing step or service condition generates a thermal mismatch stress of 35.2, 3,520, and 10,600 pounds. A tensile strength of 7,000 psi for silicon dioxide is used in the above calculations, according to Handbook of Applied Engineering Science, Eds. R. Bolf and G. L. Tieve, Chemical Rubber Co., Cleveland, Ohio, 1970, p 138.

Hence, a circuit processing step involving a temperature change of mere 199 degrees Centigrade can fail the thin, straight oxide layer on the top device edge or boundary AB or 51 of FIG. 5 device. Yet practically all conventional devices having straight square or rectangular edges.

On the other three edges BC, CD, and DA, the conditions are more favorable. There are curvature-related strain and stressrelief taking place as described above and elsewhere and in Li's patents, e.g., U.S. Pat. No. 4,946,800. A particularly useful curvature effect can be seen as follows when applied onto the wall BC or side 52. This insulating circular wall has a radius of curvature of 0.0707 microns, and in total extends over an arc of 90 degrees. Any small arc length l on this wall can also be represented by: l=r×A. The silicon oxide wall thermally expands less than the underneath silicon substrate. For every degree Centigrade increase in temperature, a thermal mismatch strain of 0.0000022 occurs. If the wall were straight, as in wall AB, a thermal mismatch stress arises tending to fracture the thin oxide wall. With a curved field oxide insulating wall BC, CD, or DA of this invention, the thermal mismatch strain and stress are at least partly relieved through curvature-related relief mechanisms as explained above and in U.S. Pat. No. 4,946,800.

During in-situ formation of silicon dioxide from silicon via thermal oxidation or ion implantation, the silicon host material undergoes a volume expansion corresponding to a linear expansion of 29.2%. See U.S. Pat. No. 4,946,800, col. 5, lines 57–67. Similar in-situ formation of silicon nitride gives a linear expansion of only 4.3%, or 6.79 times smaller than that during oxide formation. Hence, in-situ formation from silicon of silicon nitride produces only 14.7% of the mismatch volume strain and stress of those during similar in-situ formation of silicon dioxide, if silicon oxide and nitride have comparable coefficients of thermal expansion. This huge difference at least partly explains the beneficial use of the nitride in place of at least some of the oxide in the formation of the gate layer or field insulating layer. The nitride, or mixed nitride and oxide is, thus preferred over oxide in forming the new gate or field insulating layers in the present invention. For similar reasons, the nitride or mixed nitride and oxide should also have better thermal resistances than the pure oxide.

As indicated above, existing oxide gate layers are very useful. They fail only when extremely thin films are used, mainly due to fractures and leakage or tunneling currents. Often they don't stay in place or stick to the substrate. The use of extremely and uniformly thin bowl-shaped gate layer with a curved boundary in combination with a symmetrical zerobottomed width should significantly overcome the high-stress and microcracking problems thereby forming a uniformly defect-free gate layer preventing or minimizing boron penetration, leakage current, and tunneling electrons from the gate to the substrate through the gate oxide. Merely making the new ultra-thin but perfect, curved gate (and field) layers with minimum channel length or gap size (below 20 or 10 nm) may be already sufficiently improved in device performance and reliability even without the other possible features of this invention such as the atomically liquid-smoothed gate bottom layer of purified, oriented, strengthened or even single-crystalline gate layer material grains as described above.

Making semiconductor integrated circuits is not to achieve scientific perfection, but to rapidly and cost-effectively produce sufficiently good and useful circuits with simple and the minimum processing steps using the least number of processing equipment and device materials. Engineering comprises must be repeatedly made. All relevant technical, financial, and economic considerations must be factored in. Even certain commodity prices, such as of oil, may be an important factor. As a matter of fact, simple minimum processing steps and the least number of processing equipment and device materials in fact invariably lead to higher yield and lower cost, as shown above.

Further, knowing what the desired shape, size, and thickness of the gate layer, methods other than laser heating can be used to achieve at least some of the same results. For example, starting with a wafer of an intrinsic, p-type, or n-type silicon, one can ion implant dopants, oxygen, and nitrogen to form the needed n-type region or pocket, p-type region or pocket, PN junction, oxide or nitride grooves or layers to submicron, Angstrom, or nm precisions in thickness, location, dopant or oxide concentration profile, conductivity or resistivity, . . . With the same starting wafer, thermal diffusion may also be used to achieve similar, but not exactly the same, results.

The U.S. Pat. No. 3,585,714 and 154,300 application disclose material-removing techniques, with automatic feed-back control, to form or prepare for, microscopically precise grooves or regions. BY "microscopic" in these prior patents, I mean dimensions, radius of dimensions, curvatures, thickness, accuracy originally in the range of 1 or 2 microns. But with the advances of materials science in the past 35 years, the "microscopic" in this invention now refers to 0.5 microns down to about 2 Angstroms or 1 atomic layer. These material-removing techniques often comprise the same old mechanical, chemical, chemical-mechanical-polishing (CMP), and energetic or high-velocity particles bombardment with photons, electrons, ions, and protons. These methods are useful in the practice of this invention in the formation of microscopically located gate layers and isolating grooves of any reasonable shape and size, at specific locations and accurate to submicrons down to about 2 Angstroms or 1 atomic layer. In particular, the 3-D atomic size circuits are accurate to atomic sizes, i.e., about 4 Angstroms. The groove shapes may range from cylindrical, elliptical, and spherical, and conical (U.S. Pat. No. 3,430, 109, col. 2, lines 4–5 and U.S. Pat. No. 3,585,714, col. 3, lines 70–72 and col. 9, line 6) in vertical, horizontal (application 154,300 FIG. 4), or inclined forms, and with flat, spherical, rounded, or conical bottoms. This disclosure anticipates at least December 1973 IEEE paper by Sanders et al on V-grooves which are conical grooves disclosed in Li's U.S. Pat. No. 3,430,109 patent in September 1965.

Foreign materials, such as O, N, Ge, Si, Ga, B, P, As, CVD Black Diamond, fluoridated silicate glass (FSG) with k=3.6, and spinned on low-k (k=2.7) SILK organic material from Dow Chemical in use at IBM) may be introduced into the device into the newly formed grooves, or other selected locations by various processes including ion implantation (O, N, Ge, Si, Ga, B, P, and As), CVD, physical vapor deposition (PVD), spraying, spinning on, plating, . . . Some of these added-on material may even form conductive (Al, Cu, Au, Pt, Pd) regions, layers, or leads in, e.g., semiconductors, 9-nm flash memory tunnel-oxide layer, silicon on insulator (SOI) region along side bulk Si, superconductor, magnetic, and optoelectric devices. The conductive materials may be metals such as Al, Cu, W, Ta, Hf, Zr, and Ti. The material of the isolating regions, grooves, or high-k or low-k dielectric thin films may vary from oxides (Si, Ge, AL, Hf, Zr, Ta, Ti), nitrides (Si, Ti, Al), polysilicon, glass, silicides (Ti, Ta, Zr, Hf, Co, and Ni), and silicates (Hf, Zr).

For example, in the formation of the new curved extra-thin gate layer, the silicon substrate may be, for example: 1) planarized with CMP process; 2) grooved with spherical conical or V-shaped (with rounded cylindrical, or flat bottoms. See U.S. Pat. No. 3,585,714: 3/57–58, and 9/6 and 16–17) mechanical polishers to form a horizontal concave spherical bowl or vertical deep and narrow hole; and 3) superficially surface nitrided and/or oxidized with ion-implantation. The oxidation or nitridation can be controlled with precision feed-back control to achieve exact ultra-sensitive film thickness control. The feed-back control preferably is aided by real-time sensing with one or more precision electrooptic sensors to sense color, reflectivity, emissivity, surface smoothness, and other thinfilm optical characteristics. Softwares are available to fuse the sensed data in real time to achieve ultra-precision in the control of film thickness and optical, physical, and chemical properties.

As shown above, the field insulating layer of the invention can be extremely thin, from 0.5 microns through 2 Angstroms (i.e., one atomic layer). In fact, the thinner the better. A single atomic layer suffices. Even randomly or intentionally added impurity atoms are useful to form single-electron devices. But because of this thinness, the field layer is only curved only in one direction, i.e., horizontally. To make this layer curved vertically appears to be hardly practical or possible at present.

However, the gate insulating layer of the invention can also be extremely thin, from 0.5 microns through 2 Angstroms (i.e., 1 atomic layer), with about the same accuracy in lateral dimensions.

The new field insulation layer can also be formed by ion implantation. As shown below, a wave form consisting preferably of multiple sinusoidal curved segments is more effective than both straight line or a simpler curved structures. The wavy or curved structures can be formed by having a wavy movement of the substrate relative to the ion beam. Besides forming oxide or nitride structures, ion-implanting oxygen or nitrogen may form insulating mixed oxide and nitride compounds other than of silicon. Ion implantation may also be used to implant antidopants to compensate existing dopants for forming other useful, relatively intrinsic insulating materials for device applications. When antidopants are used, p-type doping ions are implanted into n-type regions, while n-type doping ions are implanted into p-type regions to compensate the existing dopants leaving few free electron or hole carriers to improve electrical insulation.

As shown above, under an implanting voltage of one megavolt, oxygen and nitrogen ions can be introduced into silicon host to a depth of 1.7+/−0.13 and 1.87+/−0.12 microns, respectively. For modern CIS, 1.87 micron field insulating walls are sufficiently deep for practically all applications. Further, the implanted layer can be less than submicrons (e.g., down to a few atomic layers) in accuracy of sizes to minimize chip estate, and be accurate even to several Angstroms in depth, lateral dimensions, accuracies, and chemical composition profiles, as shown elsewhere.

The field layer can be a single atomic layer made of individual insulating silicon oxide or nitride atoms 47. It can be intrinsic silicon in a silicon circuit. This field layer then has substantially the same chemical composition and, therefore, coefficient of thermal expansion as those of both the pocket and the substrate. This reduces thermal mismatch strains and stresses. Ideally, not only the field layer, but the pocket and even the substrate, are of substantially the same density and material composition, except for several parts per million of foreign impurities, or uncompensated dopant impurity atoms.

To achieve full isolation, the insulating field groove must extend at least from the top surface of the source and drain regions to penetrate into the silicon substrate layer. The groove bottom has a blunt, rather than a sharp, tip or bottom. There is no notch effect. The mismatch stresses between silicon and the insulating field layer vary gradually, not abruptly, near the rounded bottom, due to curvature effects. These stresses are smaller on a curved adjoining surface than on a flat adjoining surface, due additionally to the curvature-related strain-relief mechanisms shown above. In particular, the stresses are zero in the lateral direction at the bottom if the bottom has a zero width, and minimum and symmetrically distributed when the rounded bottom is symmetrical with respect to a longitudinal bisecting plane thereof. Symmetrical stress distribution insures that both the left and right side of the device component fail with equal probability giving an overall enhanced device reliability. Proper focused laser processing produces the zero bottom width and symmetrical depression shape.

The invented process uses the minimum number of device materials processed in simple processes. Experts in the art have recognized that the more complicated the device materials and production process actually lowers the device yield but increases the final cost. The process also control the thermal expansion and contraction in all directions and during all processing steps.

The traditional thermally grown silicon dioxide gate dielectric has worked remarkably well for thick oxide films. Thin oxide layer, however, has problems with boron penetration and tunneling through the oxide. A partial solution has been obtained with a sequential in situ steam generation and rapid plasma nitridation process. This two-step oxidation/nitridation approach is useful for oxides down to 20 A in thickness.

The following United States patents or application relating to solid state device of the present invention are made of record:

Peltzer's U.S. Pat. No. 3,648,125 on "Method of Fabricating Integrated Circuits";

Li's U.S. Pat. No. 3,430,109 on "Solid-State Device with Differentially Expanded Junction Surfaces";

Li's U.S. Pat. No. 3,585,714 on "Method for Making Solid-State Devices";

Li's U.S. Pat. No. 5,874,175 on "Ceramic Composite";

Li's Application Serial No. 154,300 on "Method for Making Solid-State Device"; Devices, filed Jun. 18, 1971;

Li's application Ser. No. 08/483,937 and Ser. No. 08/483, 938, both filed on Jun. 7, 1995 entitled "Integrated Circuit Device" and "Method of Making Solid State Device" respectively; and Li's U.S. Pat. No. 4,690,714 on "Method of Making Active Solid State Devices".

I hereby incorporate the above-referenced patents and also patents or papers of Shockley, Gale, Kellett et al, Sibley, Gibbons into this application. K.

The invention, as described above, is not to be construed as limited to the particular forms disclosed herein, since these are to be regarded as illustrative rather than restrictive. For example, various combinations, equivalent substitutions, or other modifications of the preferred embodiments described herein are obviously possible in light of the description, without departing from the spirit of the invention. In particular, Ge, Si—Ge, InP, GaAs, InSb, and other III—V and IIV—VI compounds may, e.g., replace Si. Other useful materials include various semiconducting compounds consisting essentially of at least two elements respectively selected from two different groups of the periodic table.

Also, instead of silicon oxide or nitride, oxynitrides, composite oxide/nitride, and high-dielectric (high-k) or low-k dielectrics for the gate, isolating region, or similar components in any solid-state device to achieve the same purpose as the gate layer or insulating region in MOS or CIS circuits.

Semiconductor integrated circuits such as MOS, CIS, bipolar, silicon-on-insulator, and silicon-germanium devices are covered in this invention. Other solid-state devices such as electro optical, various sensors and detectors, and electrooptomagnetic devices or circuits can also use the designs of this invention to achieve unique or improved performance and reliability, particularly as to heat, power, vibration, impact, and high accelerations and decelerations.

It is also to be understood that the following claims are intended to cover all of the generic and specific features of the invention herein described, and all statements of the scope of the invention which, as a matter of language, might be said to fall therebetween.

For example, insulating chain or panel 61, 61', 61", . . . may not be atomic but have appreciable widths in a direction normally of the paper in FIG. 6, and also in depths extending horizontally so that single impurity atom 66 now be ionimplanted insulator or dopant atomic chain or panel itself. On the other hand, each of the semiconductor regions 62, 63, 64, 65, . . . , may be only single atomic layers of p-type or n-type semiconductor material. Ion-implanted or atomic tweezer-picked chains or arrays of insulating material atoms 65 and impurity atoms 66 may form the required single atomic laers. As shown above, atomic layers of various materials have been formed. The semiconductor regions, reduced to single atom layers, may even be reduced in widths to be single atoms wide. The solid state optoelectrical device then reaches an ultimate miniaturization. Still, the performance of the individual components will remain unaffected. The atomic tweezer-formed semiconductor lines 61 and 62, together with the intervening insulating chain 61 of insulating atoms 65 and dopant atoms 66, forms a light sensing device only three or four atoms wide.

The optoelectrical components in the devices of the invention may vary in size from 0.5 microns through 0.1 micron down to atomic sizes of about 4 Angstroms. The devices can find many uses in various industries. For medical aplications, for example, these nanosensors may be implanted, or pass along, into any tiny blood or other body liquid vessels in different parts of any small animals to study, e.g., real-time light-sensitive biomedical or biochemical actions or reactions to medicines. Other applications in various other industries are too numerous to be cited here.

I claim:

1. A method of mass-producing a solid state device comprising:

supplying a solid state material substrate having a top surface;

forming a solid state material layer no more than 3 to 40 Angstroms thick, having at least one smooth major surface, and positioned on the top surface of the substrate; and bonding at least a portion of the solid state material layer uniformly onto at least a selected area of the device with a mechanically perfect bonding interfacial region to avoid imperfectly bonded material layer.

2. The method as in claim 1 wherein the forming step comprises forming the solid sate material layer to have at least a number of the following features: a) atomically smoothed surface; b) purified; c) uniform microstructure; d) defect-free; e) aged; f) fine-grained or subgrained; g) oriented grains or subgrains; h) narrow grains or subgrains; and i) stronger than unbonded;

the number being selected from the group consisting of one, two, and three.

3. The method as in claim 1 including forming the mechanically perfect bonding interfacial region by a liquid-diffusion process.

4. The method as in claim 1 wherein the supplying step comprises supplying as at least a part of the substrate a semiconductor material of a first conductivity type; and including: providing a semiconductor pocket of a second conductivity type to be positioned on a top contact surface of the substrate thereby forming a PN junction region between the substrate and the pocket at the top contact surface; and forming the mechanically perfect bonding interfacial region between the substrate and the pocket essentially by a liquid-diffuion process.

5. The method as claim 1 including bonding a portion of the solid state material layer to the substrate with an initially liquid bonding material which wets and fills surface defects on the solid state material layer, and then solidifies and converts these liquid-filled surface defects into reinforcements so that the bonded region is stronger than the unbonded solid state material layer itself.

6. The method as in claim 1 wherein the forming step comprises selecting the solid state material layer from the group consisting of a gate layer and a field layer.

7. The method as in claim 1 wherein the supplying step comprises selecting the substrate material from the group consisting of Si, Go, Si—Ge, InP, GaAs, SiC, InAs, superconductor, diamond, semiconductor material, iusulating material, conductive material, and mixture thereof.

8. The method as in claim 1 including forming a solid state device of a type selected from the group consisting of CMOS device, metal-oxide-semiconductor (MOS) device, conductor-insulator-semiconductor (CIS) device, electro optical device, single atom device, single molecule device, single hole device, single-atom PN junction device, single molecular pn junction device, single electron device, one-dimensional solid state device, two-dimensional solid state device, and three-dimensional solid state device.

9. The method as in claim 1 including forming the thickness of the solid state material layer using real-time monitoring and closed-loop feedback control to achieve a precision in thickness of 3 to 40 Angstroms.

10. The method as in claim 1, wherein the forming step comprises forming the solid state material layer to be atomically accurate in at least two of the following parameters: thickness, depth, curvature, shape, size, chemical composition profiling, and lateral location.

11. The method as in claim 1 including forming the solid state material layer to be sufficiently thin and flexible so as to yield sigaificantly to relieve thermal mismatch stresses and strains between different solid materials thereby preventing device failure.

12. The method as in claim 1 wherein the forming step comprises curving the solid state material layer to minimize thermal mismatch stresses through a curvature-related stress-relieving and strain-relieving mechanism.

13. The method as in claim 1 wherein the forming step comprises:
heating and melting the solid state material layer;
controllably solidifying the molten solid state material layer; and
thoroughly aging the solid state material layer during the heating, melting, and solidifying processes to enable the material layer to tolerate further device processing and temperature cycling.

14. The method as in claim 1 wherein the forming step comprises forming the solid state material layer to be curved with a radius of curvature of less than a value selected from the group consisting of 0.5 microns and 1 micron.

15. The method as in claim 1 including:
providing a PN junction region having a curved adjoining surface in the substrate; and
controlling at least one of thermal mismatch stress and in-situ volume change strain produced during device processing through a curvature-related strain-relieving and stress-relieving mechanism;
whereby the stress and strain between different solid state device materials are reduced but not completely eliminated in the device.

16. The method as in claim 15 including utilizing a reduced, smaller residual stress and strain on the curved adjoining surface of the PN junction region to improve a device performance.

17. The method as in claim 1 wherein the forming step comprises:
rapidly laser spike melting a superficially ion-implanted solid state material layer to have superficial liquidisation and liquid smoothing to thereby achieve very shallow, atomically smooth, and highly activated doped region due to the high spike heating rates;
the high spike heating rates also allowing much greater dopant concentrations than thermal equilibrium phase-diagram values to thereby provide unique and otherwise impossible-to-obtain, beneficial device performance results.

18. The method as in claim 1 wherein:
the forming step comprises forming the solid state material layer to be an electrically insulating, wavy and curved field layer formed by ion-implanting into a silicon substrate a substance selected from the group consisting of oxygen and nitrogen; and
providing a wavy and curved movement to at least one of the substrate and the ion-implanting beam relative to the other during the ion-implanting process whereby a wavy and curved field layer is produced.

19. The method as in claim 1 including forming the solid state device as a flexible, thin-film solid state device.

20. The method as in claim 1 wherein:
the forming step comprises forming the solid state material layer to comprise a plurality of semiconductor material entities spaced apart on a single plane; and including
providing a plurality of insulating material atoms or molecules filling voids between said semiconductor material entities to thereby form a single solid plane of mixed insulating and semiconductor material atoms.

21. The method as in claim 1 including forming a solid state device to have the property of allowing only a single electronic carrier selected from the group consisting of a hole and an electron to pass one at a time therethrough in a specific direction thereby forming a single carrier device.

22. The method as in claim 1 wherein:
the forming step comprises forming an insulating solid state material layer having a thickness selected form the group consisting of a single atomic layer and a single molecular layer;
selecting a single semiconductor material entity of a first conductivity type for placement on the insulating material layer;
the single semiconductor material entity being selected from the group consisting of a single semiconductor atom and a single semiconductor molecule; and
providing next to each major surface of the insulating material layer a respective semiconductor material pocket of a second conductivity type;
whereby the single selected semiconductor material entity forms two atomic or molecular PN junctions at two respective left and right sides of the insulating material layer producing an atomic or molecular transistor device.

23. The method as in claim 22 including providing a voltage gradient along a selected direction in at least one of the semiconductor pockets.

24. The method as in claim 23 including injecting a photon into one of the semiconductor pockets to generate an electron-hole pair therein; and
causing at least one of the generated carriers to be instantly recombined at site of photon injection producing at least one electrical signal in the device.

25. The method as in claim 24 for mass-producing a solid state device in the form of a solid state device a type selected from the group consisting of a 1-D panel having a resolution of more than 2,000 pixels per micron length, a 2-D panel having a resolution of more than 4,000,000 pixels per square micron, and a 3-D panel having a resolution of more than 8,000,000,000 pixels per cubic micron.

26. The method as in claim 22 including:
injecting a photon into one of the semiconductor pockets to generate an electron-hole pair therein;
causing one of the photon-generated carriers to be instantly recombined at site of photon injection generating a first electrical signal in the device; and
causing the other photon-generated carrier to move through an atomic or molecular PN junction producing a second electrical signal.

27. The method as in claim 1 wherein the forming step comprises forming the solid state material layer by a melting and solidification process; and
including improving the purity of the material of the layer by a controlled freezing process of the melt achieving orders of magnitude in purification based on a segregation coefficient on a relevant alloy phase diagram of the solid state material.

28. The method as in claim 1 wherein the forming step comprises forming the solid state material layer to be a gate layer made by controlled laser melting and solidification; and including:
laser heating to melt the gate layer material for smoothing at least the bottom major surfaces of the gate layer by an atomic surface-smoothing mechanism achieving maximum smoothness; and solidifying the molten gate layer material, sublayer by sublayer from the bottom major surface up, to purify the gate layer material not only greatly reducing and improving insulation but most at critical bottom surface facing the substrate.

29. The method as in claim 1 wherein the substrate, solid state material pockets, solid state material layer, and electrical contacts are all intrinsic, doped and less doped silicon materials, whereby the device is made resistant to dynamic forces due to impacts, vibrations, and large and rapid accelerations and decelerations because all the essential device materials have practically the same density and differ from each other by only ppm or ppb of impurities.

30. The method as in claim 1 wherein the forming step comprises forming the solid state material layer by ion implantation under 1 kilovolt of implanting voltage, straight into device material into desired location;

the implanted layer having a thickness accurate to atomic layers.

31. The method as in claim 1 wherein the forming step comprises forming the solid state material layer into a field layer separating and helping to electrically isolate device component from each others; and including;

causing the field layer on a horizontal cross-section thereof to have a multiply curved shape;

each section of the multiply curved shape having an arc length defined by: $l=r \times A$ where $l$ is the arc length, $r$ is the radius of curvature of the arc, and $A$ is the subtended arc angle, each arc section being capable of flexing so that the arc length can change by delta $l=r \times$ delta $A + A \times$ delta $r$;

the changes in delta $l$, delta $r$, and delta $A$ all being in directions to reduce thermal mismatch strain, and automatically stopping when the residual mismatch strain is reduced by the changing arc length to a point such that the multiply curved field layer can tolerate the reduced mismatch strain without device failure.

32. The method as in claim 1 including:

providing a first and a second thin semiconductor material pockets positioned on the top surface of the substrate;

laterally separating the two material pockets by a gap of substantially uniform thickness;

causing one of the material pockets to have a first conductivity type and the other one pocket to have an opposite conductivity type; and positioning the solid state material layer parallelly intermediate the two pockets to bridge the gap therebetween;

at least a major portion of the solid state material layer having an accuracy in thickness of no more than 40 Angstroms;

supplying in the solid state material layer a plurality of insulating material molecules arranged in a single plane;

providing in the planar solid state material layer at least one semiconductor material entity selected from the group consisting of a semiconductor atom and a semiconductor molecule of the first conductivity type thereby widening, by the at least one semiconductor material entity the one semiconductor material pocket of the first conductivity while forming a PN junction region where the at least one semiconductor material entity contacts the semiconductor material pocket of the opposite conductivity type, whereby the at least one atomic or molecular PN junction region provides at least one atomic diode at the at least one semiconductor entity.

33. The method as in claim 32 wherein the semiconductor atoms are selected from the group consisting of Si, Ge, diamond, and mixture thereof; and the semiconductor molecules are selected from the group consisting of Si—Ge, InP, GaAs, SiC, InAs superconductor, and mixture thereof.

34. The method as in claim 32 including utilizing at least one of stress and strain in the device to improve device performance.

35. A method of mass-producing a solid state device comprising:

supplying a solid state material substrate;

providing at least one solid state material pocket on a top surface of the substrate; and forming a curved solid state material layer with a radius of curvature of less than 1.0 micron and positioned to contact both the substrate and the solid state material pocket.

36. A method of mass-producing a solid state device comprising:

supplying a solid state material substrate;

providing at least one solid state material pocket on a top surface of the substrate; and forming a mechanically and electrically perfect solid state material layer 3 to 10 Angstroms thick and positioned to contact both the substrate and the solid state material pocket.

* * * * *